(12) United States Patent
Nakano et al.

(10) Patent No.: US 7,314,068 B2
(45) Date of Patent: Jan. 1, 2008

(54) APPARATUS FOR REPLACING GAS IN STORAGE CONTAINER AND METHOD FOR REPLACING GAS THEREWITH

(75) Inventors: Ryuichi Nakano, Shisui-machi (JP);
Yukihiro Hyobu, Tokyo (JP);
Yoshihisa Okamoto, Tokyo (JP)

(73) Assignee: Miraial Co., Ltd. (JP)

( * ) Notice: Subject to any disclaimer, the term of this patent is extended or adjusted under 35 U.S.C. 154(b) by 161 days.

(21) Appl. No.: 11/109,863

(22) Filed: Apr. 20, 2005

(65) Prior Publication Data
US 2005/0252571 A1 Nov. 17, 2005

(30) Foreign Application Priority Data
May 12, 2004 (JP) ............................. 2004-142727
May 24, 2004 (JP) ............................. 2004-153025

(51) Int. Cl.
*B65B 1/04* (2006.01)
(52) U.S. Cl. ............................. 141/7; 141/98; 141/66; 414/217; 414/939; 414/940
(58) Field of Classification Search ............... 141/98, 141/65, 67, 66, 4, 7; 414/217, 217.1, 939, 414/940
See application file for complete search history.

(56) References Cited

U.S. PATENT DOCUMENTS

| | | | | |
|---|---|---|---|---|
| 4,724,874 A | | 2/1988 | Parikh et al. ................. 141/98 |
| 5,238,503 A | | 8/1993 | Phenix et al. ................. 134/37 |
| 5,586,585 A | * | 12/1996 | Bonora et al. ................ 141/93 |
| 6,470,927 B2 | * | 10/2002 | Otaguro ....................... 141/98 |
| 6,533,000 B2 | * | 3/2003 | Saga ............................ 141/98 |
| 2002/0124906 A1 | | 9/2002 | Suzuki et al. ................. 141/98 |

FOREIGN PATENT DOCUMENTS

| | | |
|---|---|---|
| JP | 05-074921 | 3/1993 |
| JP | 11-317442 | 11/1999 |
| JP | 2000-311936 | 11/2000 |

* cited by examiner

*Primary Examiner*—Steven O. Douglas
(74) *Attorney, Agent, or Firm*—Bacon & Thomas, PLLC

(57) ABSTRACT

While gas in a general storage container with no gas inlet and in the storage container with the gas inlet is replaced in a short time, the semiconductor wafer surface is cleaned. In an apparatus for replacing gas in a semiconductor wafer storage container which includes a lid unit and a storage container main body with a gas inlet, the apparatus includes gas introducing means for introducing the gas into the storage container main body, gas evacuating means for evacuating the gas in the storage container main body, and gas circulating means for circulating the gas in the storage container main body through a chemical adsorption filter. Gas introducing means for introducing the gas from a gap between the storage container main body and the lid unit while the lid unit is opened in the storage container mounting means is provided in the storage container with no gas inlet.

34 Claims, 20 Drawing Sheets

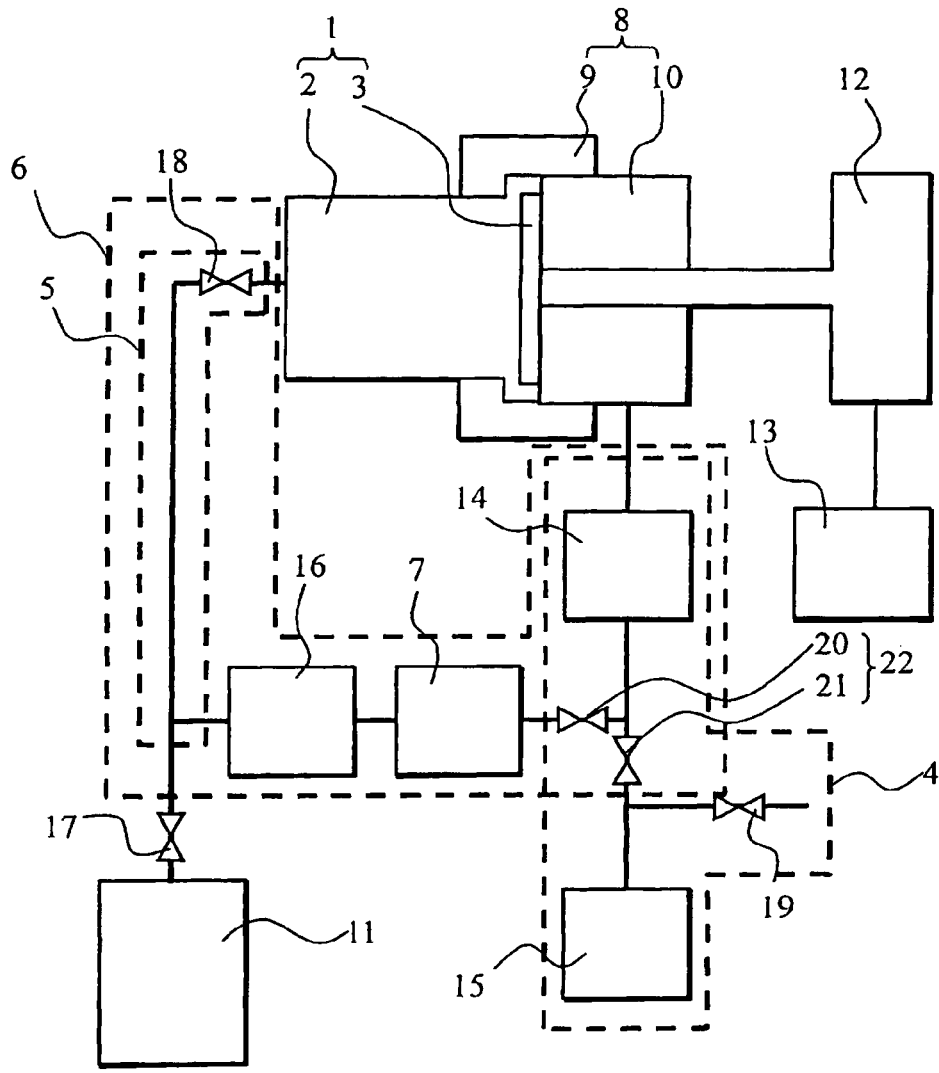

1: SEMICONDUCTOR-WAFER STORAGE CONTAINER, 2: STORAGE CONTAINER MAIN BODY, 3: LID UNIT, 4: EVACUATING MEANS, 5: GAS INTRODUCING MEANS, 6: GAS CIRCULATING MEANS, 7: CHEMICAL ADSORPTION FILTER, 8: SEMICONDUCTOR-WAFER STORAGE CONTAINER MOUNTING MEANS, 9: STORAGE CONTAINER MAIN BODY MOUNTING MEANS, 10: DUST COLLECTING MEANS, 11: GAS SUPPLY MEANS, 12: LID UNIT DETACHING MEANS, 13: LID UNIT DETACHING CONTROL MEANS, 14: DUST COLLECTING FILTER, 15: EVACUATION PUMP, 16: CIRCULATING PUMP, 17: FIRST VALVE, 18: SECOND VALVE, 19: THIRD VALVE, 20: FOURTH VALVE, 21: FIFTH VALVE, 22: GAS FLOW SWITCHING MEANS

Fig.3

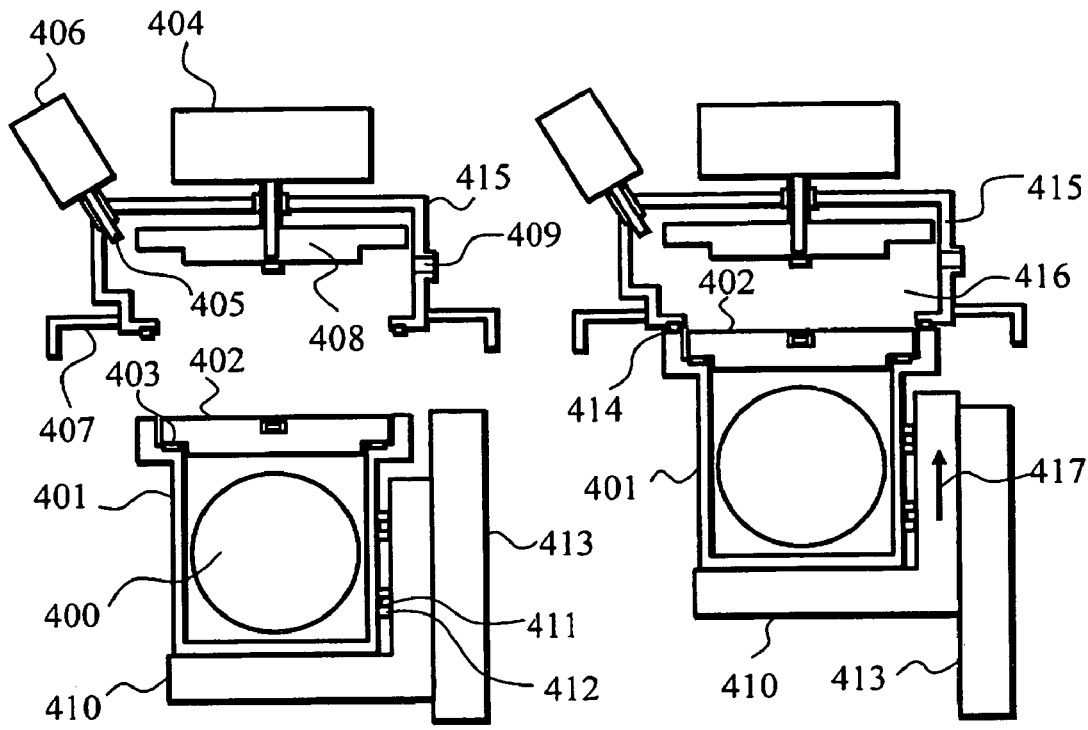
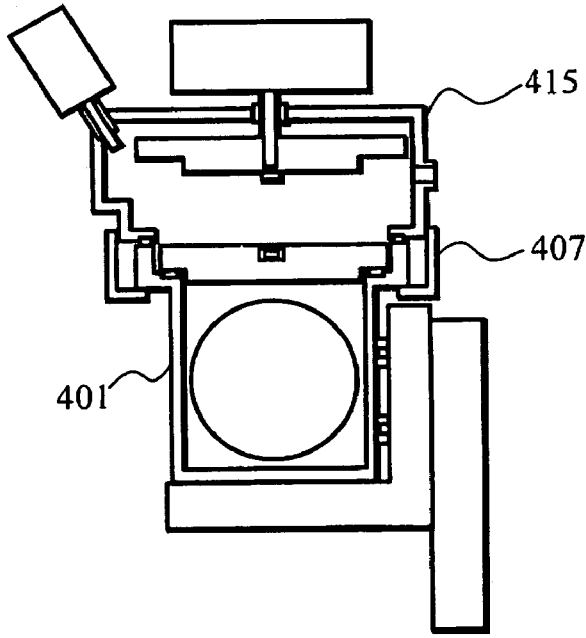
Fig.15a    Fig.15b
Fig.15c

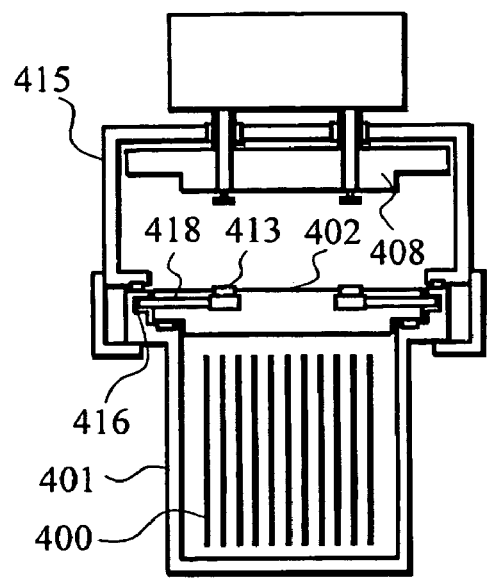
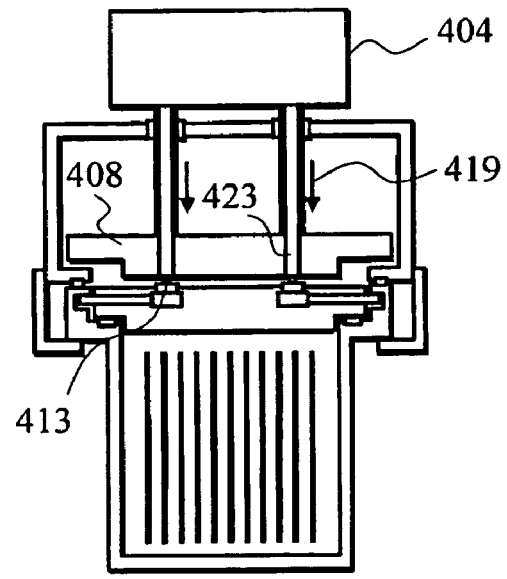
Fig.16a    Fig.16b
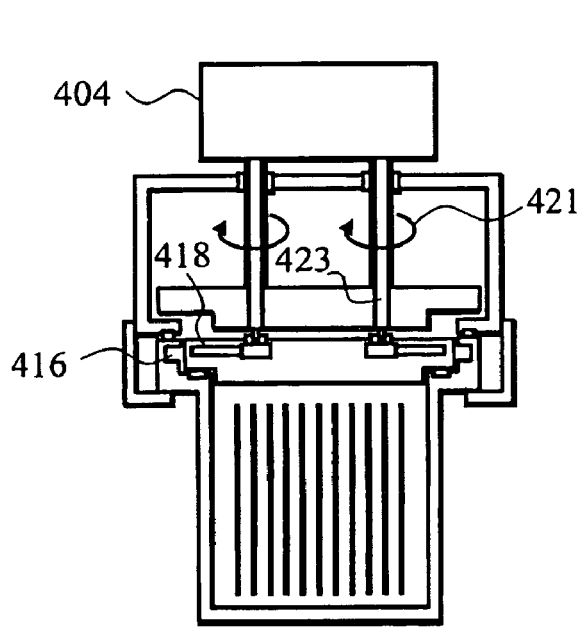
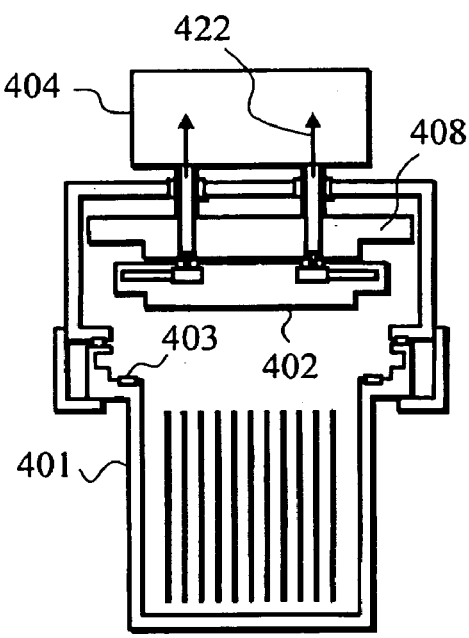
Fig.16c    Fig.16d

APPARATUS FOR REPLACING GAS IN STORAGE CONTAINER AND METHOD FOR REPLACING GAS THEREWITH

CROSS-REFERENCE TO RELATED APPLICATION

This application claims, under 35 USC 119, priority of Japanese Application No. 2004-142727 filed May 12, 2004, and Japanese Application No. 2004-153025 filed May 24, 2004.

BACKGROUND OF THE INVENTION

1. Field of the Invention

The present invention relates to an apparatus for replacing gas in a storage container and a method for replacing gas therewith. The apparatus for replacing gas in a storage container replaces gas in a storage container with an inert gas and the like while accommodating a material such as semiconductor wafers for which prevention of foreign matter adhesion is required, and the apparatus for replacing gas in a storage container also cleans surfaces of the semiconductor wafers and the like accommodated in the storage container.

2. Description of the Related Art

While a diameter of the semiconductor wafer is increased, miniaturization of a process pattern formed in the semiconductor wafer is rapidly in progress. Therefore, in the semiconductor wafer, technical requirements for the prevention of contamination and the cleanness of the surface are increased more and more.

In order to respond to such requirements, in the semiconductor wafer storage container for accommodating and storing a semiconductor wafer, there is developed the technology in which surface degradation caused by adsorption of impurity elements or moisture in the storage container is prevented while the semiconductor wafer surfaces are kept clean.

Recently, the semiconductor wafer storage container has a structure in which a lid of the storage container can mechanically be opened and closed so that the semiconductor wafers are automatically loaded and unloaded in an unmanned process room having a high cleanness level.

Further, use of the semiconductor wafer storage container, in which corrosion of the electrodes formed in the semiconductor wafer surface can be prevented by filling the inside of the storage container with the inert gas, is also becoming widespread. For example, Japanese Patent Application Laid-Open (JP-A) No. 5-74921 (pp 4 to 5, FIG. 2) discloses the technology concerning gas replacement in the storage container. In the gas replacement disclosed in JP-A No. 5-74921, an airtight maintaining type coupler which can be connected to a gas setting device is mounted on the semiconductor wafer storage container, and the storage container is filled with the dry and clean gas such as air, a nitrogen gas, and the inert gas through the airtight maintaining type coupler.

However, in the conventional gas replacing apparatus and method disclosed in JP-A No. 5-74921, because the gas replacement is performed after the air in the storage container is evacuated, it is necessary that ultimate vacuum in the storage container becomes sufficiently high after the evacuation in order to increase gas purity after the gas replacement. Therefore, the plastic storage container usually used has a problem of pressure-resistance intensity.

When the vacuum of the storage container is reduced before the gas replacement, in order to perform the high-purity gas replacement in an airtight manner, there is the problem that a sufficiently long time is required for the gas replacement.

In order to remove the moisture and impurities adsorbed onto the semiconductor wafer, it is necessary that the inside of the storage container is heated with a heating device provided in the storage container. Therefore, there are problems that the plastic storage container cannot be used and a treatment-time is lengthened.

In the conventional gas replacing apparatus and method disclosed in JP-A No. 5-74921, it is necessary to use the semiconductor wafer storage container in which a replacement gas inlet is made. Therefore, for the generally used semiconductor wafer storage container with no replacement gas inlet, there is the problem that the gas replacement cannot be performed.

SUMMARY OF THE INVENTION

An apparatus for replacing gas in a storage container of the invention is an apparatus for replacing gas in a storage container which includes a storage container main body having a gas inlet and a lid unit blocking the storage container main body, the apparatus including gas introducing means for introducing the gas into the storage container main body; gas evacuating means for evacuating the gas in the storage container main body; and gas circulating means for circulating the gas in the storage container main body through a chemical adsorption filter. The apparatus for replacing gas in a storage container of the invention enables the high-purity gas replacement in a short time by simultaneously performing the gas evacuation and introduction in the storage container.

Further, in an apparatus for replacing gas in a storage container of the invention, the lid unit of the storage container is mounted on the storage container main body in an airtight manner to communicate with a gas replacing passage while accommodated inside the apparatus for replacing gas in a storage container, the gas inside the storage container is replaced from a gap between the lid unit and the storage container main body by demounting the lid unit while the airtight state is kept. Gas introducing means is used as means for replacing the gas in the storage container from the gap between the lid unit and the storage container main body. The gas introducing means is configured to include a gas introducing nozzle which is inserted into the storage container main body from the gap between the storage container main body and the lid unit to introduce the gas into the storage container main body.

In the apparatus for replacing gas in a storage container and the gas replacing method therewith of the invention, atmosphere in the storage container can efficiently be replace with a target gas in a short time, and the surfaces of the semiconductor wafer and the like can be cleaned by circulating the replacement gas. Therefore, the process for forming the semiconductor wafer suitable for the high integration can be realized. Since the automation of the gas replacement can be achieved, the apparatus and method of the invention can be compatible with the automated load/unload system, and the contamination in the process room can be suppressed to the minimum.

Further, the already-existing semiconductor wafer storage container can be used in an as-is state, and no additional forming is required. Therefore, the invention is the extremely useful gas replacing apparatus and method which can generally be used.

BRIEF DESCRIPTION OF THE DRAWINGS

FIG. 3 is a block diagram showing a basic configuration of the gas replacing apparatus according to the invention;

FIG. 15a is a partial sectional view showing a basic configuration of a gas replacing apparatus according to a sixth embodiment of the invention and showing the state in which the semiconductor wafer storage container is mounted on a moving stage; FIG. 15b is a partial sectional view showing a basic configuration of a gas replacing apparatus according to a sixth embodiment of the invention and showing the moving stage moved on the base in the direction shown by the arrow to cause the storage container main body to come into close contact with an airtight maintaining seal provided in the dust collecting wall; and FIG. 15c is a partial sectional view showing a basic configuration of a gas replacing apparatus according to a sixth embodiment of the invention and showing the storage container main body mounting means closed to fix the storage container main body to the dust collecting wall;

FIG. 16a is a partial sectional view showing a partial configuration of the gas replacing apparatus according to the invention, as shown in FIG. 15c, viewed from the direction in parallel with the semiconductor wafer; FIG. 16b is a partial sectional view of the gas replacing apparatus according to the invention showing the lid unit rotated by the detaching control means moving the detachment moving mechanism in the direction shown by the arrow to connect the leading end of the lid unit latching structure detaching mechanism to the lid unit holding mechanism; FIG. 16c is a partial sectional view of the gas replacing apparatus according to the invention showing when the lid unit detaching control means rotates the lid unit latching structure detaching mechanism, the lid unit latching structure is removed from the connection hole thereby separating the storage container main body from lid unit; and FIG. 16d is a partial sectional view of the gas replacing apparatus according to the invention showing the lid unit detaching control means moving the detachment moving mechanism in parallel in the direction of the arrow;

DETAILED DESCRIPTION OF THE PREFERRED EMBODIMENTS

Referring now to the accompanying drawings, preferred embodiments of the invention will be described.

First Embodiment

A first embodiment of the invention will be described using the drawings. In the first embodiment, the semiconductor wafer storage container in which the semiconductor wafers are stored will be described by way of illustration as the storage container in which the inside is necessary to keep clean. The invention is not limited to the semiconductor wafer, but the invention can be also applied to the storage container for precision parts such as ICs for which a storage space is necessary to keep clean.

Figure 1:
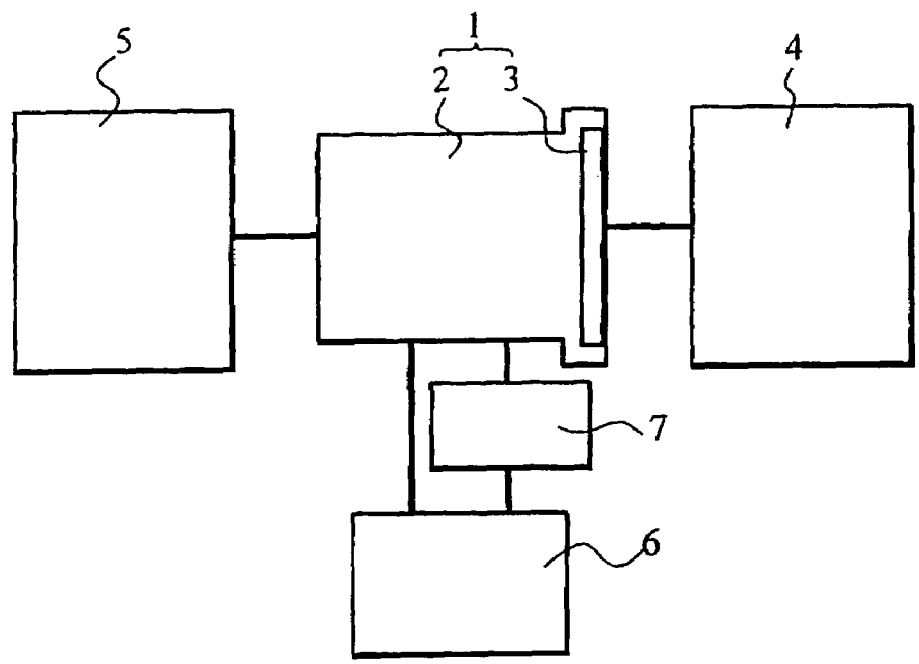
FIG. 1 is a block diagram showing a basic configuration of a gas replacing apparatus according to the invention.

FIG. 1 is a block diagram showing a basic configuration of a gas replacing apparatus for a semiconductor wafer storage container according to the invention. A semiconductor wafer storage container 1 includes a storage container main body 2 and a lid unit 3. The semiconductor wafer storage container 1 has a sealed structure with a seal so that moisture and dust in atmosphere are prevented from intruding into the container. In the sealed semiconductor wafer storage container 1, the semiconductor wafers are stored while separated from one another with predetermined intervals.

In the semiconductor wafer storage container 1 shown in FIG. 1, a replacement gas inlet is provided in the storage container main body 2, and a replacement gas outlet is provided in the lid unit 3. A circulated gas inlet and a circulated gas outlet are provided in the storage container main body 2. It is also possible that both the replacement gas inlet and the replacement gas outlet are provided in the storage container main body 2, or it is also possible that both the replacement gas inlet and the replacement gas outlet are provided in the lid unit 3. It is also possible that both the circulated gas inlet and the circulated gas outlet are provided in the lid unit 3.

A gas evacuating means 4 and the replacement gas outlet are coupled to each other with a gas evacuation pipe. The gas evacuating means 4 can evacuate air or gas in the semiconductor wafer storage container 1.

Gas introducing means 5 and the replacement gas inlet are coupled to each other with a gas introducing pipe. The gas introducing means 5 can introduce the gas into the semiconductor wafer storage container 1.

The circulated gas inlet and the circulated gas outlet are coupled to gas circulating means 6 through a circulated gas pipe to constitute a gas circulating passage. A chemical adsorption filter 7 is inserted into the gas circulating passage. The chemical adsorption filter 7 has a function of adsorbing and filtering an impurity gas component included in circulated gas. In the chemical adsorption filter 7, the moisture and impurities in the gas are removed by passing the gas through a chemical adsorbent encapsulated in a stainless-steel vessel. Well-known examples of the chemical adsorbent include metal meshes made of stainless steel or nickel whose surface is activated, porous glass fiber, and ceramic materials such as porous alumina.

The method for replacing the gas with the gas replacing apparatus shown in FIG. 1 will be described below.

In a first step, the semiconductor wafer storage container 1 is connected to the gas evacuating means 4, the gas introducing means 5, and the gas circulating means 6. In a second step, the gas evacuating means 4 is operated to start the evacuation of the air in the semiconductor wafer storage container 1. In a third step, the gas is introduced from the gas introducing means 5 into the semiconductor wafer storage container 1 while evacuated by the gas evacuating means 4.

A high-purity dry nitrogen gas is used as the gas used in the third step. According to a processing status of the semiconductor wafer in the container, sometimes dry argon gas is used. Further, for the purpose of cost reduction, sometimes the gas in which dry air is mixed with the high-purity dry nitrogen gas is used. In this case, it is desirable that at least 95% nitrogen gas is contained in the mixture gas.

At the time when the third step is started, it is not necessary that the inside of the semiconductor wafer storage container 1 is evacuated in high vacuum, but is sufficient that the semiconductor wafer storage container 1 is evacuated in a reduced-pressure state. The many conventional gas replacing apparatuses have closed-system structures in which one port is used for both the gas inlet and the gas outlet. In the conventional gas replacing apparatus, when the gas remains in the semiconductor wafer storage container 1 before the third step, because the residual gas affects the replacement gas purity, it takes at least 30 to 60 minutes to replace the gas. On the contrary, the gas replacing apparatus according to the invention has an open-system structure, so that the gas in the semiconductor wafer storage container 1 is efficiently replaced by performing the gas introduction and the gas evacuation at the same time.

After the gas introduction and the gas evacuation are performed for a given time in the third step, the gas introduction from the gas introducing means 5 to the semiconductor wafer storage container 1 and the gas evacuation from the semiconductor wafer storage container 1 by the gas evacuating means 4 are stopped in a fourth step. The time necessary for the third step depends on a volume of the semiconductor wafer storage container 1 or the processing status of the semiconductor wafer. Typically, when the semiconductor wafer storage container 1 has the volume of about 60 liters, it takes at least about 10 to 30 minutes to perform the third step.

Then, in a fifth step, the gas in the semiconductor wafer storage container 1 is circulated with the gas circulating means 6. At this point, the circulated gas has the function of removing the impurities and functional groups on the surface of the semiconductor wafer. The chemical adsorption filter 7 adsorbs the moisture and impurities to clean the circulated gas. It takes about 5 to 30 minutes to circulate the gas.

When the high-purity dry nitrogen gas having the purity in the range of about 99.5% to about 99.999% is used as the gas introduced in the third step, the moisture and impurity adsorbed on the semiconductor wafer surface can be efficiently removed in the fifth step.

In the gas introduced in the third step, a not more than about 5% reactive gas is mixed with the high-purity dry nitrogen gas not lower than 99% in purity. The reactive gas includes an ozone gas, a hydrogen gas, or an ammonia gas having the purity not lower than 99%, or the reactive gas includes a mixture gas of the above-described gases. Therefore, in the fifth step, the effect of removing the moisture and impurities adsorbed on the semiconductor wafer surface is enhanced, and the surface cleaning effect is obtained in about 5 to 10 minutes.

Thus, in the case where the dry nitrogen gas with which the reactive gas is mixed is used in the third step, in order to prevent the reactive gas from remaining in the semiconductor wafer storage container 1, the steps from the third step to the fifth step are repeated using the high-purity dry nitrogen gas in which the reactive gas is not included.

After the fifth step, in a sixth step, the replacement gas inlet, the replacement gas outlet is, the circulated gas inlet, and the circulated gas outlet are closed in the semiconductor wafer storage container 1. Then, the gas evacuating means 4, the gas introducing means 5, and the gas circulating means 6 are detached from the semiconductor wafer storage container 1 to end the gas replacing method.

Figure 2:
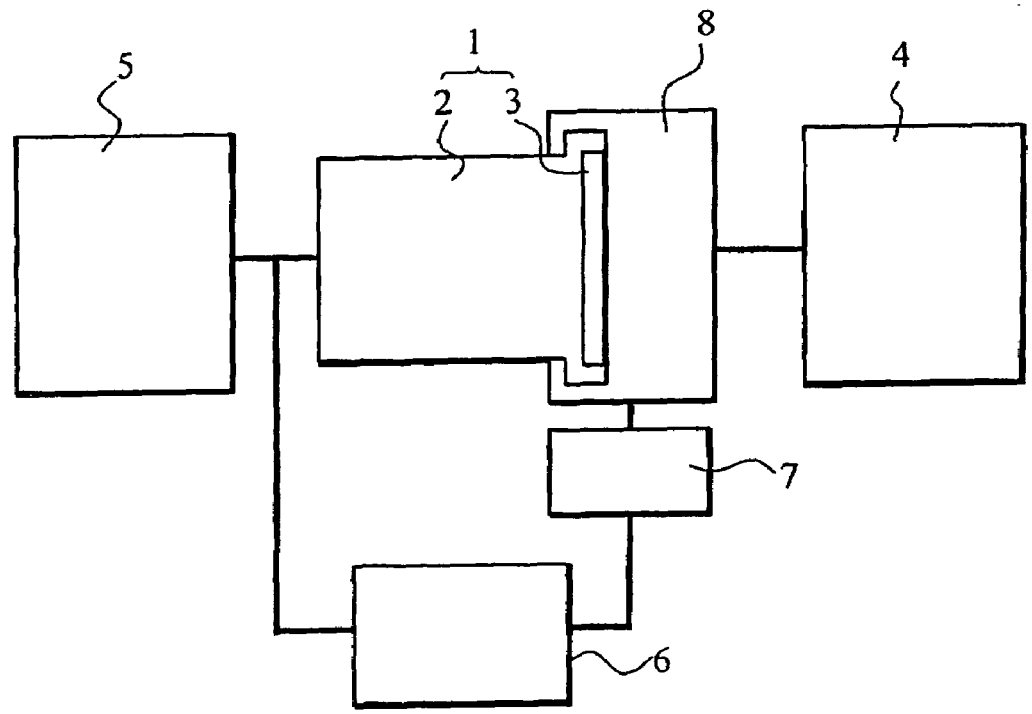
FIG. 2 is a block diagram showing a basic configuration of the gas replacing apparatus according to the invention.

FIG. 2 shows another mode of the gas replacing apparatus according to the invention. In FIG. 2, the same element as for FIG. 1 is indicated by the same numeral. In the semiconductor wafer storage container 1 of FIG. 2, the lid unit 3 is mounted so as to be entirely accommodated in the gas circulating passage of semiconductor wafer storage container attaching means 8. The semiconductor wafer storage container attaching means 8 attaches the semiconductor wafer storage container 1 in the storage container main body 2 while the storage container main body 2 is sealed. A seal for keeping airtight is arranged in a mating surface between the storage container main body 2 and the semiconductor wafer storage container attaching means 8, and the seal is attached by mechanically pressing the storage container main body 2 and the semiconductor wafer storage container attaching means 8.

The semiconductor wafer storage container attaching means 8 has a space in which the lid unit 3 can freely be opened and closed while the semiconductor wafer storage container attaching means 8 is connected to the storage container main body 2. The space constitutes a part of the gas flow passage sealed from the environment.

The storage container main body 2 and the lid unit 3 are coupled to each other by a lid unit latching structure. The storage container main body 2 and the lid unit 3 can be separated from each other by manually or mechanically releasing the lid unit latching structure.

In FIG. 2, the replacement gas inlet is provided in the storage container main body 2, and the replacement gas inlet is coupled to the gas introducing means 5. The replacement gas outlet is provided in the semiconductor wafer storage container attaching means 8, and the replacement gas outlet is coupled to the gas evacuating means 4. The circulated gas inlet is coupled to the replacement gas inlet provided in the storage container main body 2, and the circulated gas outlet is provided in the semiconductor wafer storage container attaching means 8. The circulated gas inlet and the circulated gas outlet are connected to the gas circulating means 6 to form the gas circulating passage. In the gas circulating passage, the chemical adsorption filter 7 described in FIG. 1 is attached.

The method for replacing the gas in the semiconductor wafer storage container with the gas replacing apparatus shown in FIG. 2 will be described below. The gas replacing method differs from the method for replacing the gas with the gas replacing apparatus shown in FIG. 1 in that the semiconductor wafer storage container 1 is attached to the semiconductor wafer storage container attaching means 8 in a first step.

In a second step, the semiconductor wafer storage container 1 is connected to the gas introducing means 5. The gas evacuating means 4 is previously attached to the semiconductor wafer storage container attaching means 8, and the gas circulating means 6 is previously attached to the semiconductor wafer storage container attaching means 8 and the gas introducing means 5, so that it is not necessary that the gas evacuating means 4 and the gas circulating means 6 are newly attached.

In a third step, the lid unit 3 is detached from the storage container main body in the gas passage of the semiconductor wafer storage container attaching means 8. Namely, the lid unit latching structure connecting the storage container main body 2 and the lid unit 3 is manually or mechanically released, which allows the storage container main body 2 and the lid unit 3 to be separated from each other. In the case where the lid unit latching structure is manually released, because the semiconductor wafer storage container attaching means 8 has a function of a glove box, the semiconductor wafer storage container attaching means 8 can perform not only the release of the lid unit latching structure but the separation between the storage container main body 2 and the lid unit 3 without breaking the airtight of the gas passage.

Because gas replacement post-steps are similar to the steps from the second step to the fifth step described in FIG. 1, the description of the gas replacement post-steps is omitted. In a sixth step, inside the semiconductor wafer storage container attaching means 8, the storage container main body 2 and the lid unit 3 are manually or mechanically caused to come into close contact with each other without breaking the airtight of the gas passage, and the storage container main body 2 and the lid unit 3 are connected to each other by locking the lid unit latching structure.

In a seventh step, after the replacement gas inlet of the storage container main body 2 is sealed, the gas introducing means 5 is detached from storage container main body 2, and the semiconductor wafer storage container 1 is detached from the semiconductor wafer storage container attaching means 8 to end the gas replacing step.

FIG. 3 shows another mode of the apparatus for replacing the gas in the semiconductor wafer storage container according to the invention. The mode shown in FIG. 3 has lid unit detaching means 12 and lid unit detaching control means 13. The lid unit detaching means 12 mechanically detaches the lid unit 3 from the storage container main body 2 of the semiconductor wafer storage container 1, and the lid unit detaching control means 13 controls the lid unit detaching means 12.

The storage container main body 2 and the lid unit 3 are fixed to each other by the lid unit attaching structure. The lid unit latching structure can mechanically be detached from the outside so that the semiconductor wafers stored in the semiconductor wafer storage container 1 can automatically be loaded to and unloaded from a processing chamber.

Figure 10A:
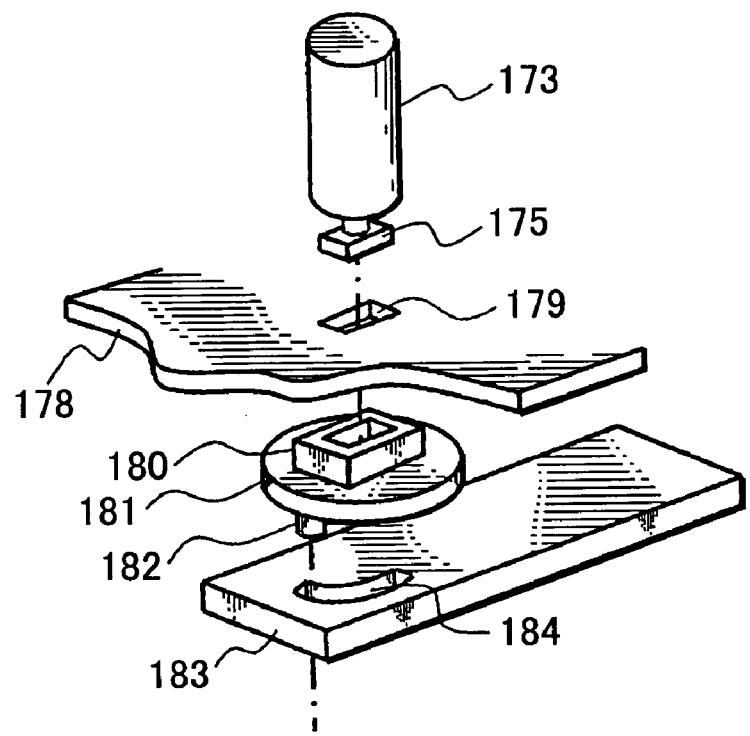
FIG. 10a is a partial sectional view of a lid latching structure of the gas replacing apparatus showing a configuration of an insertion of a detachment moving mechanism.
Figure 10B:
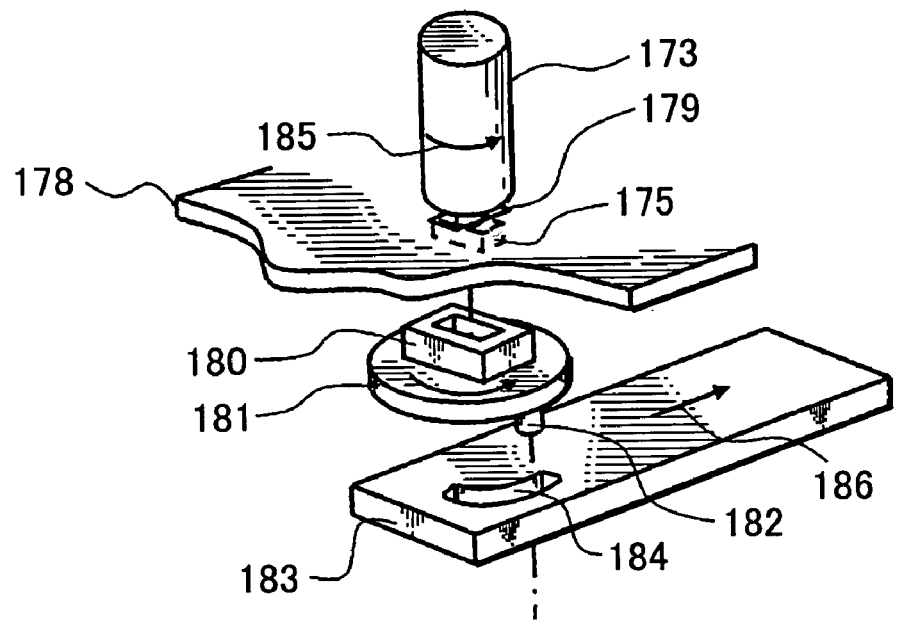
FIG. 10b is a partial sectional view of a lid latching structure of the gas replacing apparatus showing action of the lid latching structure.

FIGS. 10A and 10B show examples of a configuration of the lid unit latching structure. As shown in FIG. 10A, the lid unit latching structure includes a slide structure 183, a disc structure 181, and a guide structure 178. The slide structure 183 is moved in parallel and inserted into a connection hole made in the storage container main body 2. The rotatable disc structure 181 has a lid unit detaching means mounting structure 180 in the rotating center while a pin 182 is formed in an outer periphery. The guide structure 178 guides the movement of the slide structure. The guide structure 178 also acts as a presser of the disc structure 131. The slide structure 183 is fitted into the pin 182 provided in the outer periphery of the disc structure through a rotatable hole 184. A rectangular mounting unit 175 is formed at a leading end of a lid unit latching structure detaching mechanism 173. The mounting unit 175 is inserted into a rectangular hole made in the lid unit detaching means mounting structure 180 through a rectangular hole made in a guide structure 179.

After the mounting unit 175 is inserted into the lid unit detaching means mounting structure 180, when the lid unit latching structure detaching mechanism 173 is rotated in a direction shown by an arrow 185 of FIG. 10B, the disc structure 181 is rotated. The pin 182 inserted into the hole 184 is simultaneously rotated according to the rotation of the disc structure 181, and the slide structure 183 is moved in parallel in the direction shown by a narrow 186. As a result, the leading end of the slide structure 183 is inserted into the connection hole to connect the storage container main body and the lid unit. When the storage container main body and the lid unit are separated, the lid unit latching structure detaching mechanism 173 is rotated in the reverse direction. As the lid unit latching structure detaching mechanism 173 is rotated, the mounting unit 175 located at the leading end of the lid unit latching structure detaching mechanism 173 is supported between a lid unit supporting mechanism 180 and the guide structure 178, and the lid unit detaching mechanism 173 and the lid unit are connected and held. The lid unit detaching control means controls the lid unit detaching means.

On the other hand, the semiconductor wafer storage container attaching means 8 includes storage container main body mounting means 9 and dust collecting means 10. The dust collecting means 10 includes a dust collecting chamber. The dust collecting chamber is surrounded by dust collecting walls, and the dust collecting chamber becomes the space in which the lid unit 3 is entirely accommodated. The storage container main body 2 is closely mounted to the dust collecting wall through the airtight maintaining seal. The storage container main body mounting body 9 fixes the storage container main body 2 in an airtight manner by pressing the storage container main body 2 against the dust collecting wall with a spring structure.

The lid unit detaching means 12 has a mechanism detaching the lid unit 3 in the dust collecting means 10. The lid unit latching structure provided in the lid unit 3 is mechanically detached by the lid unit detaching mechanism.

As with the mode shown in FIG. 2, in the apparatus for replacing gas in a semiconductor wafer storage container shown in FIG. 3, the gas evacuating means 4 is coupled to the dust collecting means 10, and the gas introducing means 5 is coupled to the storage container main body 2. The gas circulating means 6 is coupled to the dust collecting means 10 and the gas introducing means 5, and the gas circulating means 6 circulates the gas in the semiconductor wafer storage container 1 through the gas circulating means 6.

The gas evacuating means 4 includes a dust collecting filter 14, an evacuation pump 15, a third valve 19, a fourth valve 20, and a fifth valve 21. These elements are connected by the gas pipes constituting the gas passage. A usual oil-sealed rotary vacuum pump can be used as the evacuation pump 15. In the case of the use of the oil-sealed rotary vacuum pump, the exhaust is discharged from the oil-sealed rotary vacuum pump through a sealed exhaust duct so that a clean room is not contaminated by oil mist. Like the chemical adsorption filter, the dust collecting filter 14 removes the micro-dust included in the evacuation gas by filtering and adsorbing the micro-dust with the filter having the sub-micron mesh or porous structure. However, unlike the chemical adsorption filter, the adsorption activity for the moisture and impurities is not required for the dust collecting filter 14.

The third valve 19, the fourth valve 20, and the fifth valve 21 switching a connection pattern of the gas passage by opening and closing these valves. The fourth valve 20 is closed and the fifth valve 21 is opened, which allows the gas passage to be coupled between the gas evacuating means 4 and the dust collecting means 10. The evacuation pump 15 is operated while the third valve 19 and the fifth valve 21 are closed, which allows the air to be removed in the gas passage between the fifth valve 21 and the evacuation pump 15. Then, when the fifth valve 21 is opened, the air is prevented from entraining into the gas evacuating means 4. In the case where the evacuation pump is stopped, the fifth valve 21 is closed, the third valve 19 is opened to return the gas passage immediately in front of the evacuation pump 15 to atmospheric pressure, and then the evacuation pump 15 is stopped. Therefore, the evacuation pump 15 can be stopped without causing the oil and dust in the evacuation pump 15 to reversely flow into the gas passage to contaminate the gas passage.

The gas introducing means 5 includes the first valve 17, the second valve 18, and the gas pipe. The gas introducing means 5 is connected to gas supply means 11. Examples of the gas supply means 11 include a compressed gas cylinder and a gas supply pipe provided in the clean room. When the first valve 17 and the second valve 18 are opened, the gas passage is connected between the gas supply means 11 and the storage container main body 2. In the case where a plurality of kinds of gas are supplied to the gas introducing means 5, the gas supply means 11 is configured by the plurality of compressed gas cylinders or the plurality of gas supply pipes.

The gas circulating means 6 includes a circulating pump 16, the chemical adsorption filter 7, the dust collecting filter 14, the second valve 18, and the fourth valve 20. These elements are connected by the gas pipes constituting the gas passage. In the embodiment shown in FIG. 3, the gas circulating means 6 is connected to the gas evacuating means 4 and the gas introducing means 5. The dust collecting filter 14, the second valve 18, and the fourth valve 20 are shared among the gas circulating means 6, the gas evacuating means 4, and the gas introducing means 5. The first valve 17 and the fifth valve 21 are closed and the fourth valve 20 is opened, which allows the gas circulating passage to be formed for the storage container main body 2 and the dust collecting means 10. Namely, the fourth valve 20 and the fifth valve 21 form gas flow switching means 22 such that the fourth valve 20 and the fifth valve 21 is opened and closed to switch the gas flows of the evacuating means and the gas circulating means.

Figure 4A:
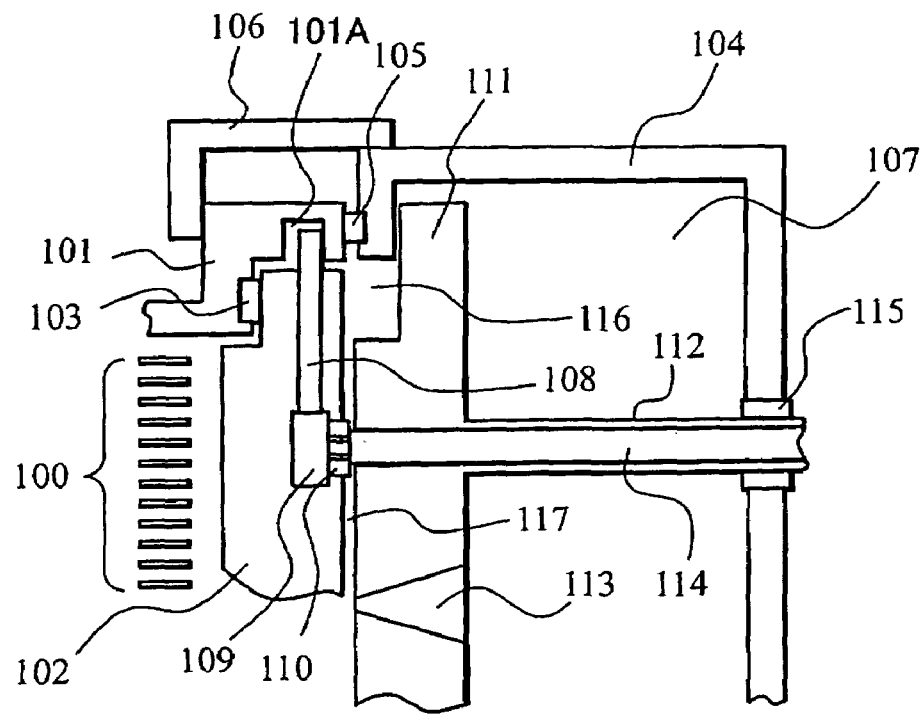
FIG. 4a is a sectional view showing the partial configuration of the gas replacing apparatus when a lid unit is closed.
Figure 4B:
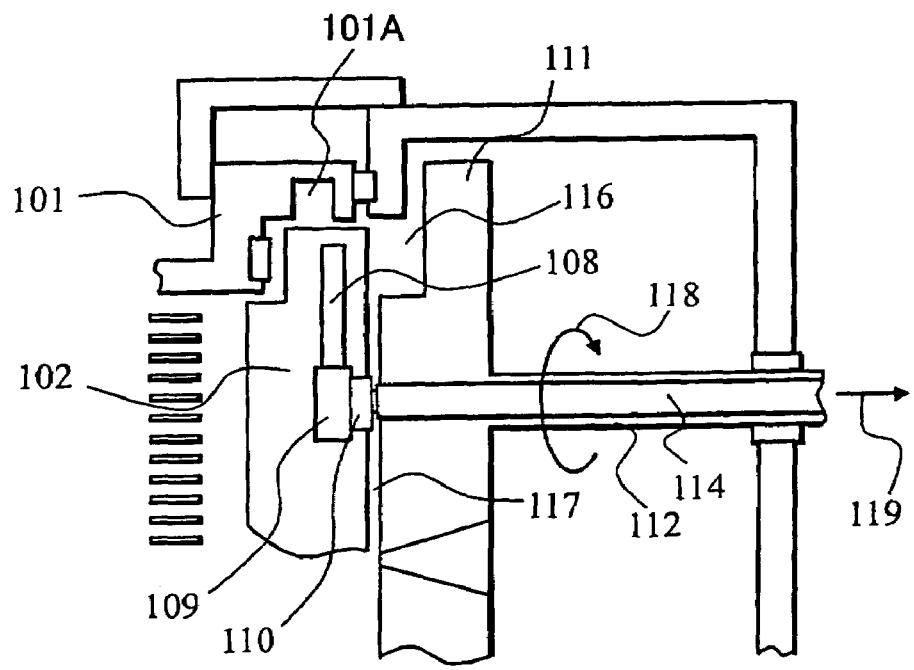
FIG. 4b is a sectional view showing the partial configuration of the gas replacing apparatus when the lid unit is opened.

FIG. 4 is a sectional view showing a detail configuration near the dust collecting means with respect to the semiconductor wafer gas circulating apparatus shown in FIG. 3. FIGS. 4A and 4B are partial sectional views showing a state in which the storage container main body and the lid unit are connected by the lid unit latching structure. The semiconductor wafer storage container is formed by a storage container main body 101 and a lid unit 102. The semiconductor wafer storage container is attached while sealed with an airtight maintaining seal 103. The semiconductor wafers 100 are stored in the semiconductor wafer storage container. Usually an elastic structure referred to as O-ring is used as the airtight maintaining seal 103. The elastic structure is made of rubber resins or silicone resins.

The lid unit latching structure is provided in the lid unit 102. The lid unit latching structure is formed by a slide structure 108 and a disc structure 109. A lid unit holding mechanism 110 is provided in the rotating center of a disc structure 109. As described above, the slide structure 108 is mounted in the pin provided in the outer periphery of the disc structure 109 through the rotatable hole, and the slide structure 108 is moved in parallel according to the rotation of the disc structure 109. The lid unit holding mechanism 110 provided near the rotating center of the disc structure 109 has a hole or groove structure into which the rectangle is inserted. The lid unit 102 can be held by inserting the rectangular structure formed at the leading end of a lid unit latching structure latching mechanism 114 into the lid unit holding mechanism 110. An end portion of the slide structure 108 connects the storage container main body 101 and the lid unit 102 by inserting the end portion of the slide structure 108 into a connection hole 101A made in the storage container main body 101.

The lid unit detaching mechanism includes a gas passage forming mechanism 111, a lid unit latching structure detaching mechanism 114, and a detachment moving mechanism 111. In the example shown in FIG. 4, the gas passage forming mechanism 111 and the detachment moving mechanism 112 are integrally formed, and the lid unit latching structure detaching mechanism 114 is rotatably mounted in the gas passage forming mechanism 111 and the detachment moving mechanism 112. The detachment moving mechanism 112 can be moved in parallel in a dust collecting chamber 107 through a port made in a dust collecting wall 104. Because an airtight maintaining seal 115 is mounted in the port, even if the detachment moving mechanism 112 is moved, the gas in the dust collecting room 107 never leaks to the outside.

The dust collecting wall 104 and the storage container main body 101 are closely mounted by the storage container main body mounting means 106. At this point, the airtight maintaining seal 105 plays a role preventing the leakage of the gas from the mounting portion.

When the storage container main body 101 is mounted on the dust collecting wall 104, the lid unit detaching mechanism is moved and brought close to the lid unit 102, and the rectangular leading end of the lid unit latching structure detaching mechanism 114 is inserted into the lid unit holding mechanism 110 and stopped. At this point, predetermined gaps are formed between the gas passage forming mechanism 111 and the lid unit 102. The gap is formed, such that the gap is broad in a circumferential portion of the gas passage forming mechanism 111 and the gap is narrow in other portions. The gap formed in the circumferential portion of the gas passage forming mechanism 111 is referred to as a pump chamber 116, and the gap formed in other portions is referred to as airflow gap 117. Specifically the gap of the pump chamber 116 ranges from about 10 to about 20 mm, the gap of the other portions is not more than about 1 mm. These gaps may be formed so that the volume of the pump chamber 116 is sufficiently larger than that of the gap spaces of other portions.

On the other hand, a communication hole 113 is formed near the center of the gas passage forming mechanism 111. The communication hole 113 is communicated with the airflow gap 117 and the dust collecting chamber 107. A diameter of the communication hole 113 is formed so as to be gradually increased from the side of the airflow gap 117 toward the side of the dust collecting chamber 107. Although only one communication hole 113 is shown in FIG. 4, it is also possible that the plurality of communication holes 113 are made.

FIG. 4B is a partial sectional view showing the state in which the storage container main body and the lid unit are separated from each other.

When the lid unit latching structure detaching mechanism 114 inserted into the lid unit holding mechanism 110 is rotated as shown by a narrow 118, the disc structure 109 is also rotated, and the slide structure 108 mounted to the pin provided in the outer periphery of the disc structure 109 through the rotatable hole is moved in parallel, which allows the slide structure 108 is extracted from the connection hole 101A as shown in FIG. 4B. Therefore, the storage container main body 101 and the lid unit 102 are separated from each other.

Then, the detachment moving mechanism 112 moves the lid unit 102, the lid unit latching structure detaching structure 114, and the gas passage forming mechanism 111 in parallel in the direction of an arrow 119 in a collective manner, which allows the seal to be broken between the storage container main body 101 and the lid unit 102 to form the gap between the storage container main body 101 and the lid unit 102. The gap forms the gas passage during the gas replacement or gas circulation.

As can be seen from FIG. 4B, even if the lid unit 102 is moved, the gaps of the pump chamber 116 and the airflow gap 117 are never changed.

Figure 5:
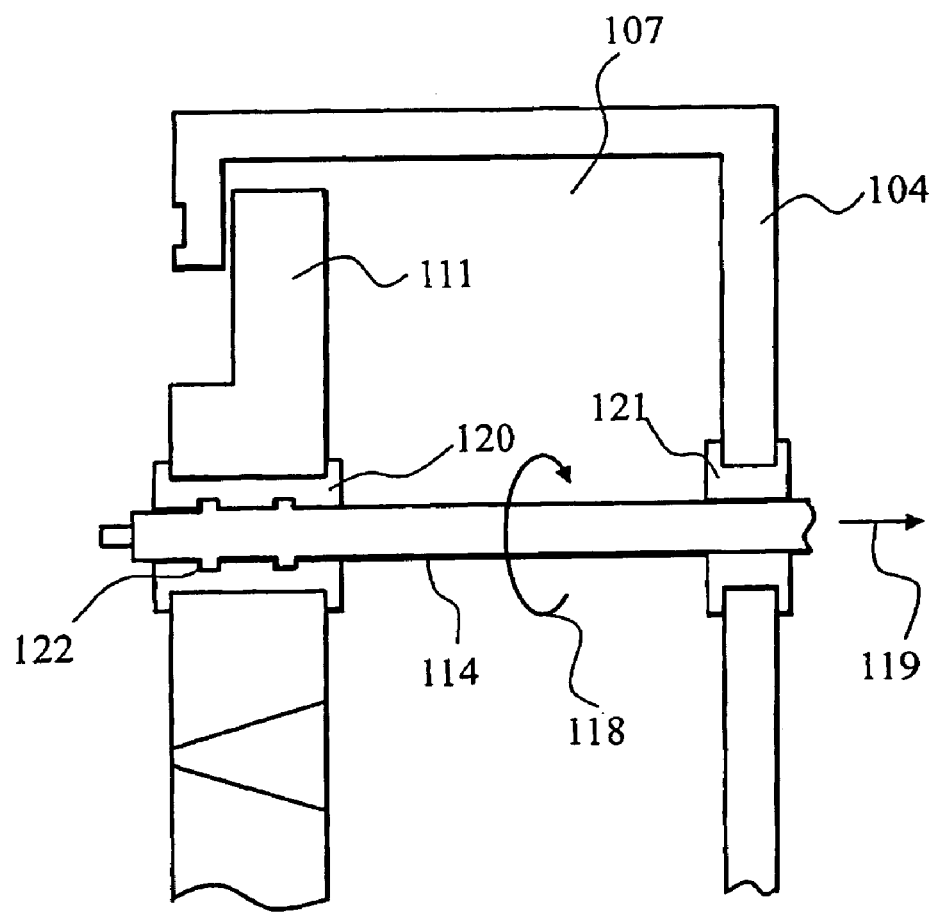
FIG. 5 is a sectional view showing a partial configuration of the gas replacing apparatus according to the invention.

FIG. 5 schematically shows a partial sectional view of another mode of the apparatus for replacing gas in a semiconductor wafer storage container according to the invention. In the mode shown in FIG. 5, one rotating and moving shaft functions as both the lid unit latching structure detaching mechanism and the detachment moving mechanism. The lid unit latching structure detaching mechanism and the detachment moving mechanism constitutes a part of the lid unit detaching mechanism. Therefore, the structure of the lid unit detaching mechanism can remarkably be simplified. The rotating and moving shaft is mounted in bearings 120 and 121. It is possible that general ball bearing is used as the bearings 120 and 121. However, sometimes the dust and the oil mist might be generated to contaminate the gas passage. Therefore, it is preferable that a fluorine-contained polymer bearing is used as the bearings 120 and 121. The fluorine-contained polymer bearing has good slide properties, and the dust and the oil mist are never generated in the fluorine-contained polymer bearing. Teflon (product name from DuPont) is well known as the specific material.

The bearing 120 is mounted in the gas passage forming mechanism 111 to connect the rotating and moving shaft, and an anti-disconnection latch 122 is formed in order to prevent the disconnection of the rotating and moving shaft. The bearing 121 is mounted in the dust collecting wall 104 to connect the rotating and moving shaft. The bearing 121 also supports the rotating and moving shaft so that the rotating and moving shaft can be moved in parallel. By providing at least two rotating and moving shafts in the gas passage forming mechanism 111, only the rotating and moving shaft can be rotated as shown by the arrow 118 while the gas passage forming mechanism 111 is not rotated. Further, the rotating and moving shaft and the gas passage forming mechanism 111 can be moved in the dust collecting chamber 107 by moving the rotating and moving shaft in the direction of an arrow 119.

Figure 7:
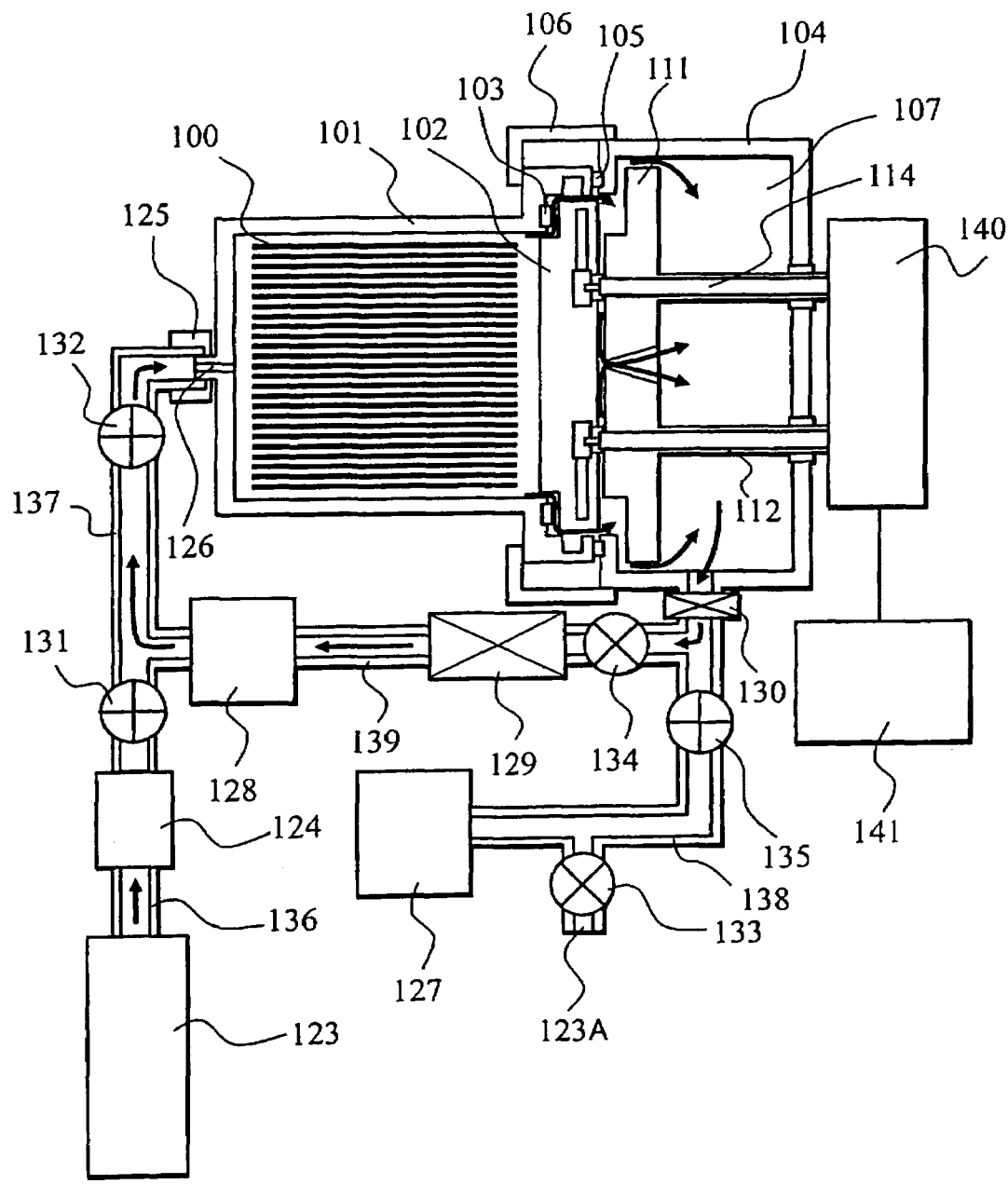
FIG. 7 is a sectional view showing the configuration of the gas replacing apparatus according to the invention and the circulated gas flow.
Figure 8:
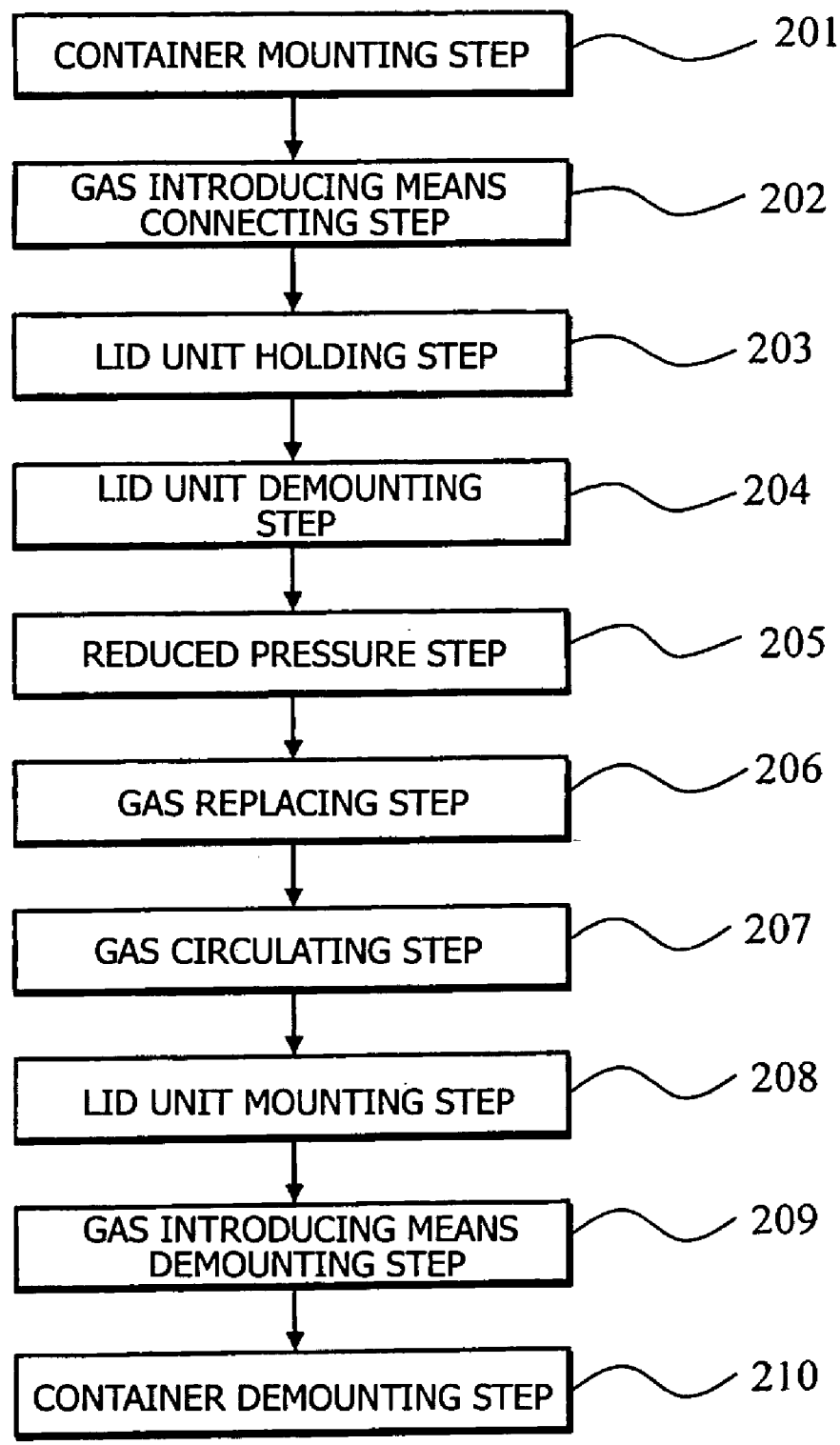
FIG. 8 is a flowchart showing steps of a gas replacing method according to the invention.

The gas replacing method in which the apparatus for replacing gas in a semiconductor wafer storage container of the invention is used will be described below. FIG. 8 is a flowchart showing the method for replacing the gas in the semiconductor wafer storage container of the invention shown in FIG. 3. The steps for replacing the gas in the semiconductor wafer storage container will be described referring to FIGS. 3, 6, 7, and 8.

Figure 6:
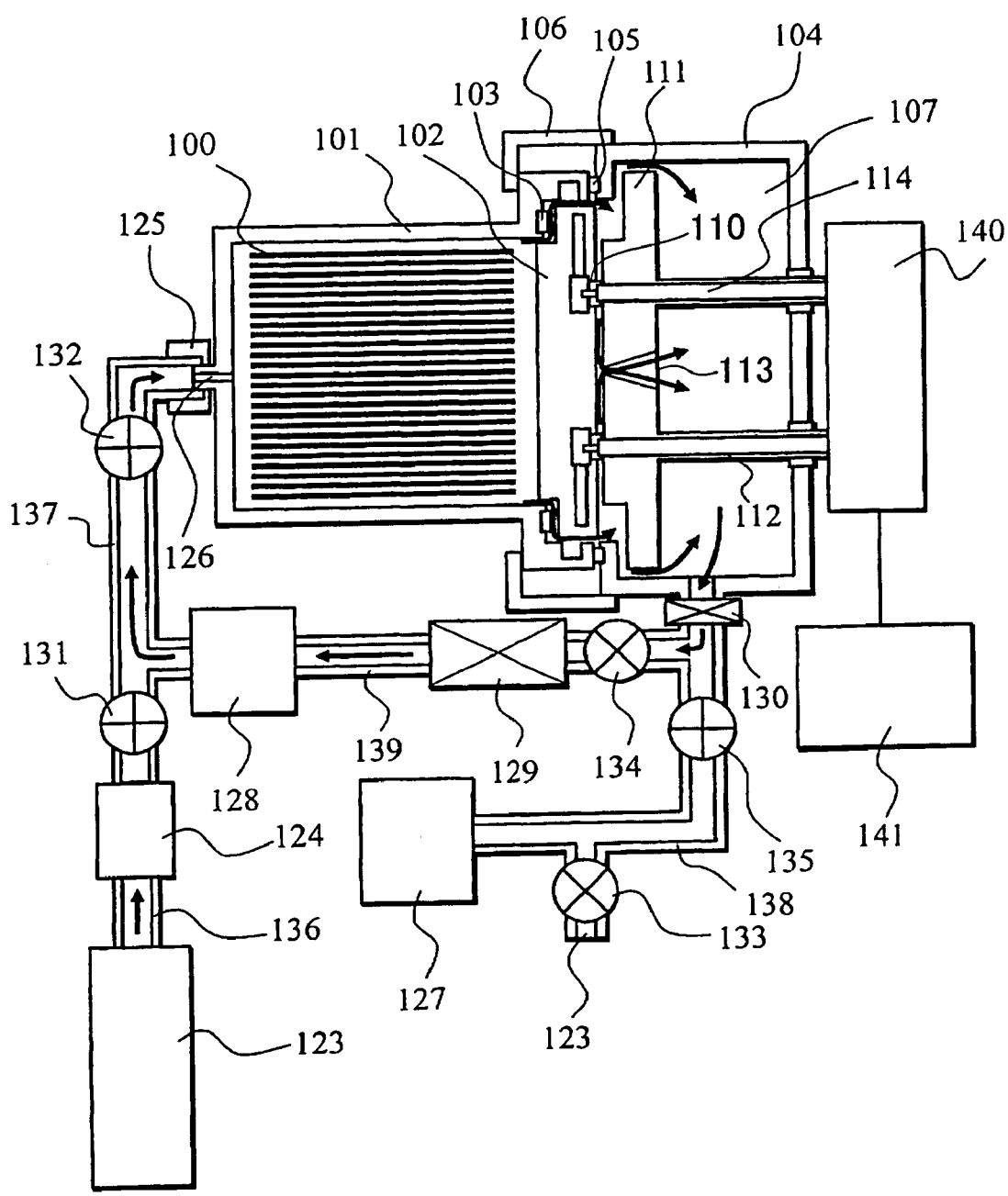
FIG. 6 is a sectional view showing a configuration of the gas replacing apparatus according to the invention and a circulated gas flow.

In a container mounting step 201, while the lid unit is caused to enter the dust collecting chamber, the semiconductor wafer storage container is mounted on the semiconductor wafer storage container mounting means in an airtight manner. At this point, as shown in FIG. 6, the storage container main body 101 and the lid unit 10 are sealed with the airtight maintaining seal 103. Usually twenty-five semiconductor wafers 100 are stored in the storage container while arranged in parallel. In the container mounting step 201, the storage container main body 101 is closely fixed by using the storage container main body mounting means 106 to mechanically press the storage container main body 101 against the airtight maintaining seal 105 provided in the dust collecting wall 104.

Then, in a gas introducing means connecting step 202, the replacement gas inlet and the gas introducing means of the storage container main body are connected. In FIG. 6, the gas introducing means is connected to a replacement gas inlet 126 provided in the storage container main body 101. The gas introducing means includes a first valve 131, a second valve 132, and a gas introducing pipe 137. An airtight maintaining type coupler 125 connects the gas introducing means and a replacement gas inlet 126 provided in the storage container main body 101. The airtight maintaining type coupler 125 includes a male die and a female die. The male die of the airtight maintaining type coupler is previously mounted on the replacement gas inlet 126, and the female die is mounted on the gas introducing means.

Accordingly, the connection between the storage container main body 101 and the gas introducing means only by inserting the male die into the female die. The male die of the airtight maintaining type coupler keeps the airtight of the semiconductor wafer storage container before the insertion, and the gas passage is formed between the storage container main body 101 and the gas introducing means by the insertion.

In a lid unit holding step 203, both the gas passage forming mechanism and the lid unit latching structure detaching mechanism are moved and brought close to the lid unit, and the lid unit is connected and held by the lid unit holding mechanism. Specifically, in FIG. 6, both the gas passage forming mechanism 111 and the lid unit latching structure detaching mechanism 114 are moved and brought close to the lid unit 102 by the detachment moving mechanism 112, and the leading end of the lid unit latching structure detaching mechanism 114 is inserted into the lid unit holding mechanism 110 to hold the lid unit. The lid unit latching structure detaching mechanism 114 is driven by transmission of force from a drive source such as a motor in a detaching drive mechanism 140 provided outside the dust collecting wall 104. The drive source in the detaching drive mechanism 140 is controlled by a control circuit in a detaching-drive control mechanism 141.

Then, in a lid unit demounting step 204, the lid unit latching structure which connects the storage container main body and the lid unit is operated by the lid unit latching structure detaching mechanism, and the storage container main body and the lid unit are separated. Specifically, in FIG. 6, the lid unit latching structure detaching mechanism 114 is rotated by the detaching drive mechanism 140 to demount the lid unit latching structure, and the detachment moving mechanism 112 is moved by using the detaching drive mechanism 140 again, which allows the storage container main body 101 and the lid unit 102 to be separated by simultaneously moving the lid unit latching structure detaching mechanism 114, the gas passage forming mechanism 111, and the lid unit 102 supported by the lid unit holding mechanism 110. The gap is formed between the airtight maintaining seal 103 and the lid unit 102 by the separation of the storage container main body 101 and the lid unit 102, which allows the gas passage to connect between the storage container main body 101 and the dust collecting chamber 107.

In a reduced pressure step 205, the evacuating means evacuates the dust collecting chamber to reduce the pressure. Specifically, in FIG. 6, a fifth valve 135 and a third valve 133 are closed, and an evacuation pump 127 performs degassing in an evacuating pipe 138. At this point, a fourth valve 134 is closed. Then, the fifth valve 135 is opened to evacuate the air in the dust collecting chamber 107. At this point, because the storage container main body 101 and the lid unit 102 are separated, the air in the storage container main body 101 is also evacuated at the same time.

In a gas replacing step 206, while the evacuating means evacuates the dust collecting chamber, the gas is introduced to the storage container main body from the replacement gas inlet of the storage container main body using the gas introducing means. The gas replacing step 206 will specifically be described referring to FIG. 6. The gas introducing means is connected to the gas supply means which includes a gas supply source 123, a reduced-pressure valve 124, and a gas supply pipe 136. The compressed gas cylinder or gas piping in the clean room, which is of the gas supply source, is in the compressed state of about 7 $kg/cm^2$. The compressed state of about 7 $kg/cm^2$ is regulated to appropriate supply gas pressure, e.g. in the range of 1.2 to 1.5 $kg/cm^2$, by a reduced pressure valve 124, and the gas is introduced into the storage container main body 101 by opening the first valve 131 and the second valve 132. The gas replacing step 206 is started immediately after the reduced pressure valve 205 is started. It is desirable that the gas replacing step 206 is performed after the insides of the storage container main body 101 and the dust collecting chamber 107 are evacuated to the high vacuum state. However, it is necessary to use the semiconductor wafer storage container having excellent withstanding pressure properties. Because the semiconductor wafer storage container is usually molded by a plastic material, from the viewpoint of withstanding pressure properties of the container, it is not preferable that the high vacuum state is made in the reduced pressure state 205.

The introduced gas is the dry nitrogen gas having purity not lower than 95%, preferably the dry nitrogen gas having purity in the range of 99.9 to not lower than 99.999%. The supplied dry gas flows in a laminar flow between the semiconductor wafers 100 stored in the storage container main body 101, and the gas flows into the pump chamber described in FIGS. 4A and 4B through the gap between the storage container main body 101 and the lid unit 102. The formation of the pump chamber reduces passage resistance of the gap formed between the storage container main body 101 and the lid unit 102. Further, at the same time, because the pump chamber becomes the reduced pressure state compared with the inside of the storage container main body 101, the gas flowing through the gap flows into the pump chamber while gaining momentum. Therefore, the micro-dust adhering to the gap between the storage container main body 101 and the lid unit 102 is blown away and removed, which results in the cleaning of the surface. As the procedure is in progress, the gas pressure is gradually increased in the pump chamber. Because the volume of the dust collecting chamber 107 is sufficiently larger than that of the pump chamber, the pressure in the dust collecting chamber 107 is sufficiently smaller than that of pump chamber. Therefore, the gas and the micro-dust are discharged into the dust collecting chamber 107 from the gap between the gas passage forming mechanism 111 and the dust collecting wall 104 shown in FIGS. 4A and 4B and from the airflow gap. The gas passing through the airflow gap is discharged to the dust collecting chamber 107 through the communication hole 113 made in the gas passage forming mechanism 111. The diameter of the communication hole 113 is formed so as to be gradually increased from the airflow gap toward the dust collecting chamber 107, so that the passage resistance is reduced, and the gas passing through the airflow gap flows without decreasing speed. As a result, the gas flowing through the airflow gap removes the micro-dust adhering to the surface of the lid unit 102.

The gas and the micro-dust which flow into the dust collecting chamber 107 are filtered by the dust collecting filter 130, and the gas is exhausted outside the evacuation pump 127 through the fifth valve 135 and the evacuation pipe 138. The gas flow in the gas replacing step 206 is shown by the arrow in FIG. 6.

The gas replacing step 206 is performed until the gas purity is sufficiently increased in the replacement gas passage and the micro-dust in the dust collecting chamber 107 is sufficiently adsorbed and filtered by the dust collecting filter 130. After the gas replacement is performed for a sufficient time, the first valve 131 and the fifth valve 135 are continuously closed. Then, while the third valve 133 is opened to take the air from a gas outlet 123A into the evacuation pipe, the evacuation pump 127 is stopped to end the gas replacing step 206.

When the semiconductor wafer storage container is stored while the pressure is reduced in the semiconductor wafer storage container, the first valve 131 is closed first. When the semiconductor wafer storage container is stored while the pressure is increased in the semiconductor wafer storage container, the fifth valve 135 is closed first. When storage gas pressure is controlled, a vacuum gage is placed at an appropriate position in the gas passage, e.g. at the dust collecting wall 104, and the valve can be opened and closed while the gas pressure in the gas passage is measured. Electromagnetic valves which can electrically be opened and closed are used as the valve shown in FIG. 6, and the open and close of the electromagnetic valves are controlled by a control circuit (not shown), which enables automation of the opening and closing operations of the valves.

Then, in a gas circulating step 207, the gas is circulated in the order of the storage container main body, the dust collecting means, and the replacement gas inlet of the storage container. The gas circulating step 207 is one in which the fourth valve 134 shown in FIG. 7 is opened and a circulating pump 128 is operated to circulate the gas. The gas circulating step 207 forms the gas circulating passage in which the dry gas replaced in the gas replacing step 206 flows in the order of the circulating pump 128, the gas introducing pipe 137, the second valve 132, the replacement gas inlet 126, the storage container main body 102, the dust collecting chamber 107, the dust collecting filter 130, the fourth valve 134, a chemical adsorption filter 129, and a circulated gas pipe 139. In the gas circulating step 207, the impurities and moisture adsorbed on the surfaces of the semiconductor wafers 100 are removed by the circulated gas and filtered by the chemical adsorption filter 129, so that the surfaces of the semiconductor wafers 100 can be cleaned. In the configuration shown in FIG. 7, because the dust collecting filter 130 is included in the gas circulating passage, the micro-dust included in the circulated gas is filtered and cleaned even in circulated gas. The gas flow in the gas circulating step is shown by the arrow of FIG. 7. After the gas circulating step 207 is performed for a predetermined time, the circulating pump 128 is stopped, and the fourth valve 134 is closed to end the gas circulating step 207.

In a lid unit mounting step 208, both the lid unit latching structure detaching mechanism and the gas passage forming mechanism are moved to insert the lid unit into the storage container main body, and the lid unit latching structure is operated by the lid unit latching structure detaching mechanism to connect the storage container main body and the lid unit. The lid unit mounting step 208 is one which reverses the lid unit demounting step 204 and the lid unit holding step 203. Namely, in FIG. 7, the lid unit latching structure detaching mechanism 114, the gas passage forming mechanism 111, and the lid unit 102 are moved by the detachment moving mechanism 112 to bring the lid unit 102 into close contact with the storage container main body 101, the lid unit latching structure detaching mechanism 112 is rotated to insert the lid unit latching structure into the connection hole, and the storage container main body 101 and the lid unit 102 are connected in the airtight manner. Then, the lid unit latching structure detaching mechanism 114 and the gas passage forming mechanism 111 are moved by the detachment moving mechanism 112 to demount the lid unit latching structure detaching mechanism from the lid unit holding mechanism.

Then, in a gas introducing means demounting step 209, the gas introducing means is demounted from the replacement gas inlet of the storage container main body. This step can easily be performed by disengaging the male die and the female die of the air tight maintaining type coupler 125.

Finally, in a container demounting step 210, the semiconductor wafer storage container is demounted from the dust collecting means. Then, the gas replacing method of the invention is ended.

Figure 9:
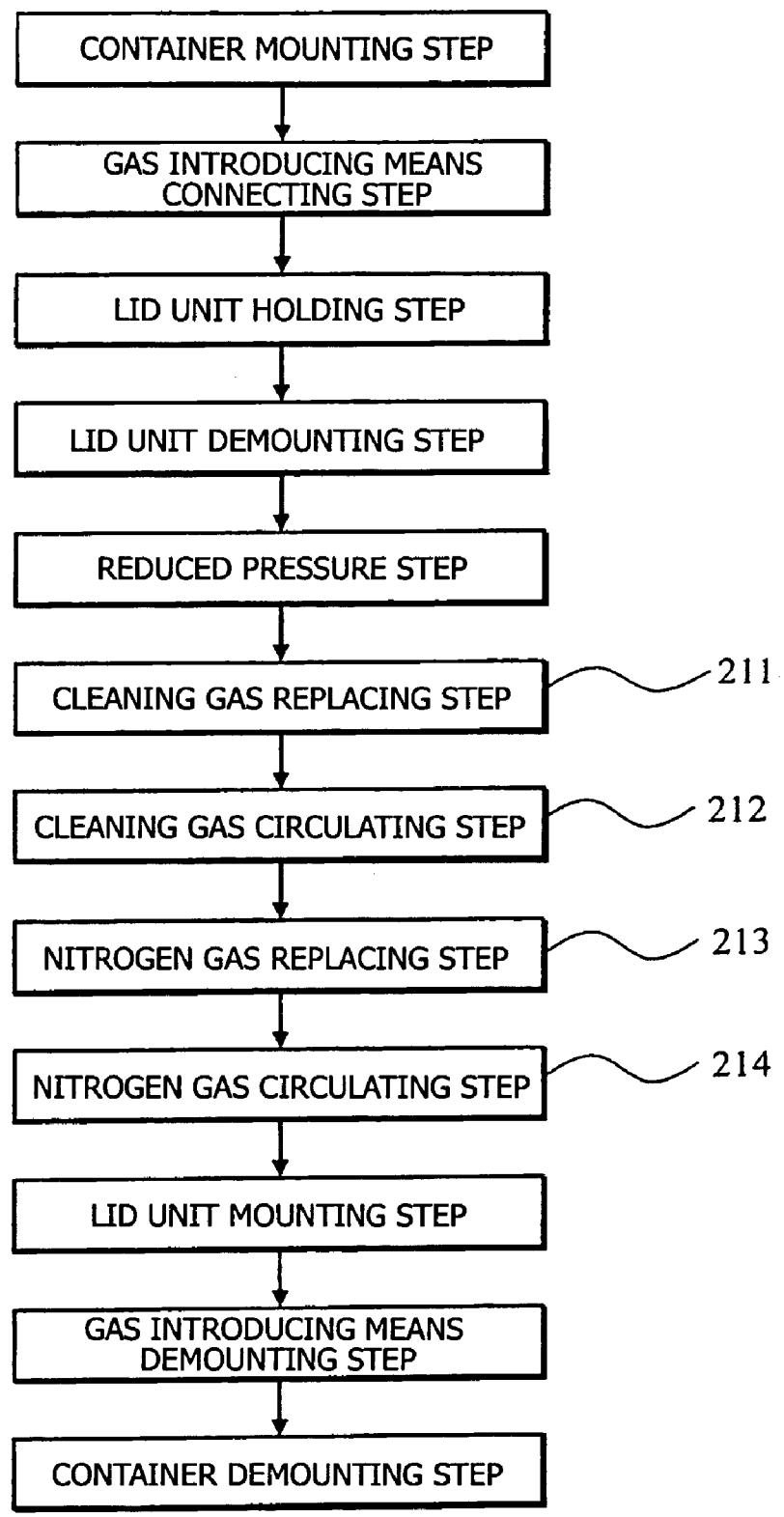
FIG. 9 is a flowchart showing steps of a gas replacing method according to the invention.

In order to improve cleanness of the semiconductor wafer surface in a short time, a cleaning gas replacing step and a cleaning gas circulating step can be added between the reduced pressure step 205 and the gas replacing step 206 shown in FIG. 8. In this case, a flowchart of a method for replacing gas in a semiconductor wafer storage container of the invention is shown in FIG. 9. In the flowchart shown in FIG. 9, as described above, the gas replacing step 206 and the gas circulating step 207 shown in FIG. 8 are performed using the reactive gas which is mixed with the dry nitrogen gas to the extent of not more than about 5% as the replacement gas. Addition of the steps obtains the cleaning effect of the semiconductor wafer surface in a shorter time compared with the flowchart shown in FIG. 8.

As shown in FIG. 9, when a cleaning gas replacing step 211 and a cleaning gas circulating step 212 are performed, sometimes the reactive gas remains in the semiconductor wafer storage container to damage the semiconductor wafer surface in a time-varying manner, so that a nitrogen gas replacing step 213 and a nitrogen gas circulating step 214 are performed subsequent to the cleaning gas replacing step 211 and the cleaning gas circulating step 212. The nitrogen gas replacing step 213 and the nitrogen gas circulating step 214 differ from the cleaning gas replacing step 211 and the cleaning gas circulating step 212 only in that the dry nitrogen gas having the purity not lower than 95% with no reactive gas is used. The nitrogen gas replacing step 213 and the nitrogen gas circulating step 214 are performed, which allows the semiconductor wafers to be stored in the semiconductor wafer storage container for a long time without damaging the semiconductor wafer surfaces.

When the method for replacing gas in a semiconductor wafer storage container of the invention shown in FIG. 8 is performed, first gas supply means for supplying the reactive gas and second gas supply means for supplying the nitrogen gas are used as the gas supply means. The reactive gas including at least one gas component of the ozone gas, the hydrogen gas, and the ammonia gas, which is mixed with the nitrogen gas in a proportion of not more than about 5%, can be used as the reactive gas supplied from the first gas supply means. It is possible that the reactive gas including at least one gas component of the ozone gas, the hydrogen gas, and the ammonia gas is mixed with the nitrogen gas supplied from the second gas supply means in a predetermined proportion. When the gases are mixed using the first gas supply means and the second gas supply means, a gas mixture ratio is adjusted with a gas flowmeter.

When a trace quantity of active gas is used in the cleaning gas replacing step 211 and the cleaning gas circulating step 212, or when the reactive gas has the low reactivity, the nitrogen gas circulating step 214 can be omitted.

As described above, according to the apparatus for replacing gas in a semiconductor wafer storage container and the method for replacing gas therewith of the invention, while the atmosphere in the semiconductor wafer storage container can be replaced with the target gas in a short time, the semiconductor wafer surface can be cleaned by circulating the replacement gas. Therefore, the semiconductor wafer forming step suitable for high density can be realized. Since the gas replacement can be automatized, the gas replacing apparatus and the gas replacing method are compatible with the automatized load/unload system, and the contamination in the process room such as the clean room can be suppressed to a minimum level.

The apparatus for replacing gas in a storage container of the first embodiment is the apparatus for replacing the gas in the storage container which has the lid unit and the storage container main body with the replacement gas inlet. The apparatus includes gas introducing means for introducing the gas into the storage container main body, the gas evacuating means for evacuating the gas in the storage container main body, and the gas circulating means for circulating the gas in the storage container main body through the chemical adsorption filter.

The configuration of the gas replacing apparatus of the invention can realize the open-system gas replacing apparatus. As a result, the high-purity gas replacement can be performed in a short time by simultaneously evacuating the gas from and introducing the gas into the storage container, so that the above problem can be solved.

The semiconductor wafer surface can be cleaned in a short time at room temperature by circulating the gas in the storage container through the chemical adsorption filter, so that the above problem can be solved. Particularly, when the nitrogen gas or the nitrogen gas including the reactive gas not more than 5% is used as the circulated gas, the impurity elements and the functional groups adsorbed on the semiconductor wafer surface can efficiently be removed in a short time.

The storage container mounting means capable of mounting the storage container main body is provided so that the lid unit is entirely accommodated in the gas replacing passage, the evacuating means for evacuating the gas in the storage container main body through the storage container mounting means is mounted, and the gas circulating means capable of sequentially circulating the gas among the storage container main body, the storage container mounting means, and the replacement gas inlet is mounted. Therefore, the reverse flows of the introduced gas or the circulated gas can be prevented, the micro-dust adhering to the lid unit can be removed to realize the gas replacement with high cleanness in a short time, and the above problem can be solved.

The storage container mounting means includes: the dust collecting means for separating micro-dust generated during the gas replacing step, the dust collecting means being formed by the dust collecting chamber formed to be surrounded by at least a dust collecting wall; and the storage container main body mounting means for mounting the storage container on the storage container main body mounting means while airtightness is held, the lid unit being entirely accommodated inside the dust collecting chamber. Further, the lid unit detaching means for detaching the lid unit from the storage container main body inside the dust collecting means is configured. The lid unit detaching means includes the lid unit holding mechanism which holds the lid unit; a lid unit latching structure detaching mechanism which detaches the lid unit latching structure connecting the storage container main body and the lid unit; the gas flow forming mechanism which is brought close to the lid unit so as to have a predetermined gap, the gas flow forming mechanism forming the gas passage; the detachment moving mechanism which simultaneously moves the lid unit, the lid unit holding mechanism, the lid unit latching structure detaching mechanism, and the gas flow forming mechanism to form a predetermined gap between the storage container and the lid unit; and the detachment driving mechanism which separately drives the lid unit holding mechanism, the lid unit latching structure detaching mechanism, and the detachment moving mechanism. Therefore, the gas replacement of the semiconductor wafer storage container can mechanically automatized, the contamination in the clean room can be minimized, and the apparatus and method of the invention can be compatible with the load/unload process in the semiconductor process, so that the above problems can be solved.

The airtight maintaining seal is provided in the mating surface between the storage container main body and the storage container mounting means to prevent the leakage of the gas to the outside environment. Therefore, high-purity gas replacement is enabled.

The gas passage forming mechanism which is in contact with the lid unit while separated at the predetermined gap is formed to arrange a pump chamber whose volume of the gap formed in a circumferential portion of the lid unit is sufficiently larger than a volume of the gap formed in a central portion of the lid unit, and the gas passage forming mechanism which is in contact with the lid unit while separated at the predetermined gap has at least one communication hole which communicates the dust collecting chamber and the gap formed by the lid unit, the gap being exclusive of the pump chamber, the communication hole being made such that a diameter is gradually increased from the gas side toward the dust collecting chamber side. Therefore, the micro-dust adhering to the lid unit can efficiently be removed.

Both the lid unit latching structure detaching mechanism and the detachment moving mechanism are configured by the same rotating and moving shaft which is rotatable and movable in parallel, the rotating and moving shaft is rotatably connected in the gas passage forming mechanism by a fluorine-contained polymer bearing with an anti-disconnection latch, and the rotating and moving shaft is connected in the dust collecting wall by another fluorine-contained polymer bearing in an airtight manner while being rotatable and movable in parallel. Therefore, the apparatus configuration can be simplified, the apparatus can be configured so that the micro-dust is not generated, and the purity of the gas replacement can be improved.

On the other hand, a method for replacing gas in a storage container including the following steps of (a) to (e) is realized as the method for replacing the gas in the storage container using the apparatus for replacing gas in a storage container of the invention. The method for replacing gas in a storage container including the steps of: (a) mounting a storage container on a gas replacing apparatus; (b) evacuating air in a storage container main body with gas evacuating means; (c) introducing gas into the storage container main body with gas introducing means while the gas introducing means evacuates the gas in the storage container main body; (d) terminating introduction of the gas into and the evacuation of the gas from the storage container main body to cause gas circulating means to circulate the gas in the storage container main body through a chemical adsorption filter; and (e) demounting the storage container from the gas replacing apparatus.

According to the method for replacing gas in a storage container of the invention, the gas replacement and the cleaning of the semiconductor wafer can be realized in a short time, so that the above problems can be solved.

The effect of cleaning the semiconductor can be enhanced by using a dry gas including a not lower than 95% nitrogen gas.

A gas replacing method including the following steps (a) to (j) is disclosed as a method for replacing gas in a storage container using an apparatus for replacing gas in a container of the invention. The method includes the steps of: (a) mounting the storage container on storage container mounting means in an airtight manner while a lid unit is accommodated in a dust collecting chamber; (b) connecting a gas inlet of the storage container main body and gas introducing means; (c) bringing a gas passage forming mechanism and a lid unit latching structure detaching mechanism close to the lid unit by simultaneously moving the gas passage forming mechanism and the lid unit latching structure detaching mechanism, and connecting and holding the lid unit by a lid unit holding mechanism; (d) operating a lid unit latching structure to separate the storage container main body and the lid unit by the lid unit latching structure detaching mechanism, the lid unit latching structure connecting the storage container main body and the lid unit; (e) evacuating the dust collecting chamber by evacuating means to reduce pressure; (f) introducing the gas into the storage container main body from the gas inlet of the storage container main body by gas introducing means, while the evacuating means evacuates the dust collecting chamber; (g) circulating the gas in the order of the storage container main body, the dust collecting means, and the gas inlet of the storage container; (h) inserting the lid unit into the storage container main body by simultaneously moving the gas passage forming mechanism, the lid unit latching structure detaching mechanism, and the lid unit, and operating the lid unit latching structure to connect the storage container main body and the lid unit by the lid unit latching structure detaching mechanism; (i) demounting the gas introducing means from the gas inlet of the storage container main body; and (j) demounting the storage container from the dust collecting means.

According to the gas replacing method of the invention, the gas replacement of the storage container can automatically or semi-automatically be realized, the high-purity gas replacement and the cleaning of the semiconductor wafer can be realized in a short time, so that the above problems can be solved.

Further, the following steps (s) and (t) are added prior to the step (h) of the above gas replacing method of the invention. Therefore, the cleaning of the semiconductor wafer can effectively be performed in a shorter time. Namely, the gas replacing method of the invention further including the steps of (s) introducing a cleaning gas into the storage container main body from a gas inlet of the storage container main body by gas introducing means while the evacuating means evacuates the dust collecting chamber, a not more than 5% reactive gas being mixed with a dry nitrogen gas in the cleaning gas; and (t) circulating the cleaning gas in the order of the storage container main body, the dust collecting means, and the gas inlet of the storage container.

The effect of cleaning the semiconductor can be enhanced by using the dry nitrogen gas including at least one gas component of an ozone gas, a hydrogen gas, and an ammonia gas as the reactive gas.

Second Embodiment

A second embodiment of the invention will be described referring to the drawings. Even in the second embodiment, the semiconductor wafer storage container in which the semiconductor wafers are stored will be described by way of illustration as the storage container whose inside is necessary to keep clean. However, the invention is not limited to the semiconductor wafer, but the invention can be also applied to the storage container for any precision part such as ICs for which a storage space is necessary to keep clean.

Figure 11:
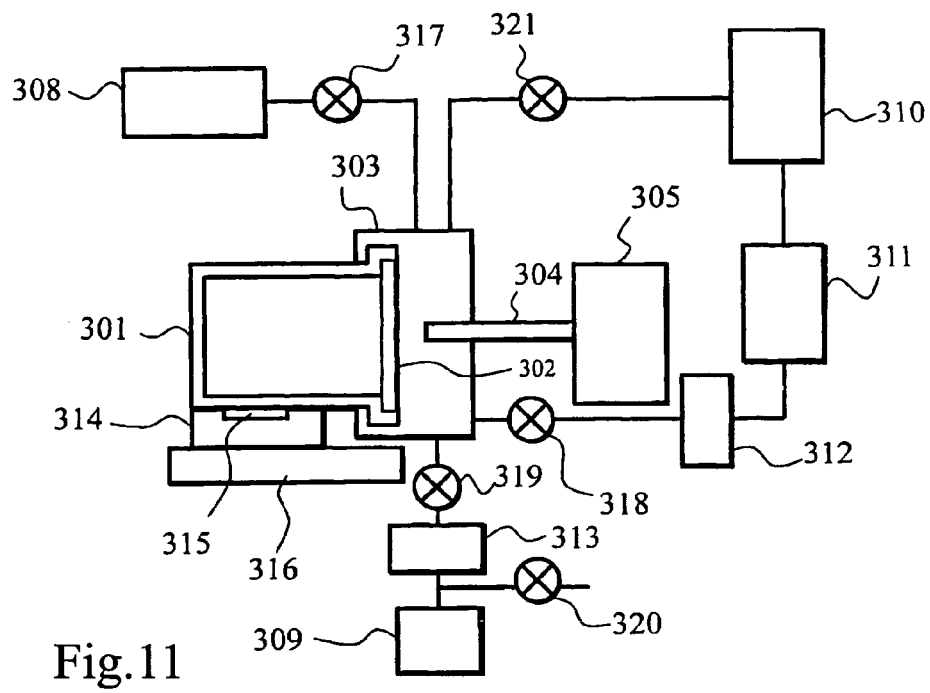
FIG. 11 is a block diagram showing a basic configuration of a gas replacing apparatus according to a second embodiment of the invention.

FIG. 11 shows a basic configuration of an apparatus for replacing gas in a semiconductor wafer storage container according to the invention. A semiconductor wafer storage container includes a storage container main body 301 whose inside is necessary to keep clean and a lid unit 302 which seals the inside of the storage container main body 301. The semiconductor wafer storage container has the sealed structure with the seal so that the moisture and dust in the atmosphere are prevented from intruding into the container. In the storage container main body 301 of the sealed semiconductor wafer storage container, the semiconductor wafers are stored in parallel while separated from one another with predetermined intervals by groove plates (not shown).

A semiconductor wafer storage container mounting means 303 in FIG. 11 is the device which replaces the gas in the storage container main body 301. In the state in which the semiconductor wafer storage container mounting means 303 is mounted on the storage container main body 301 while a lid unit 302 is entirely covered with the semiconductor wafer storage container mounting means 303, the semiconductor wafer storage container mounting means 303 demounts the lid unit 302 to put in and take out the gas. The seal (not shown) is provided in an engagement portion between the semiconductor wafer storage container mounting means 303 and the storage container main body 301, and the storage container main body 301 is mounted on the semiconductor wafer storage container mounting means 303 in an airtight manner by the seal. Therefore, while the storage container main body 301 is mounted on the semiconductor wafer storage container mounting means 303, the lid unit 302 is mounted in the air tight manner so as to be entirely accommodated in a gas replacement passage formed in the semiconductor wafer storage container mounting means 303. As a result, the lid unit 302 is demounted from the storage container main body 301, which allows the inside of the storage container main body 301 to be connected to the gas replacement passage while the airtightness is maintained. A mechanism which grasps and fixes the storage container main body 301 (later-mentioned storage container main body mounting means 407 and the like) is provided in the semiconductor wafer storage container mounting means 303.

On the other hand, the gas piping from gas supply means 308 is coupled to the semiconductor wafer storage container mounting means 303, the introduction and stop of the gas into the semiconductor wafer storage container mounting means 303 can be controlled by opening and closing a first valve 317. Namely, the gas introducing means includes the gas supply means 308, the gas piping connected to the gas supply means 308, and the first valve 317.

An evacuation pump 309 is connected to the semiconductor wafer storage container mounting means 303 through the gas piping, which forms the gas evacuating means for evacuating the gas in the storage container main body 301. The gas evacuating means includes a dust collecting filter 313, a fourth valve 319, and a fifth valve 320 as an opening and closing valve. When the evacuation pump 309 is operated to open the fourth valve 319 while the fifth valve 320 is closed, the gas in the semiconductor wafer storage container mounting means 303 can directly be evacuated, and the gas in the storage container main body 301 can indirectly be evacuated. The micro-dust contained in the evacuated gas is removed by the dust collecting filter 313. The dust collecting filter 313 also has the function of preventing the micro-dust from reversely flowing into the semiconductor wafer storage container mounting means 303 from the evacuation pump 309 side.

The oil-sealed rotary vacuum pump can be used as the evacuation pump 309. In this case, the oil-mist generated from the oil-sealed rotary vacuum pump is filtered by an oil-mist trap and the like and exhausted from an exhaust duct (not shown).

In the case of the use of the evacuation pump such as the oil-sealed rotary vacuum pump which generates the oil-mist and the like, the fifth valve 320 is opened after the fourth valve 319 is closed, the gas piping immediately in front of the evacuation pump 309 is returned to the atmospheric pressure, and the evacuation pump 309 is stopped so that the oil-mist reversely flow toward the semiconductor wafer storage container mounting means 303.

The gas circulating means for circulating the gas with a circulating pump 311 is mounted on the semiconductor wafer storage container mounting means 303. A chemical adsorption filter 310, a dust collecting filter 312, a second valve 318, and a third valve 321 are inserted into a gas circulating passage formed by the gas circulating means. The chemical adsorption filter 310 has the function of adsorbing and filtering the impurity gas components contained in the circulated gas. In the chemical adsorption filter 310, the moisture and impurities in the gas are removed by passing the gas through the chemical adsorbent encapsulated in the stainless-steel vessel. Well-known examples of the chemical adsorbent include metal meshes made of stainless steel or nickel whose surface is activated, porous glass fiber, and ceramic materials such as porous alumina. Both the second valve 318 and the third valve 321 are closed during the gas introduction and evacuation. The gas circulating passage is formed by opening the second valve 318 and the third valve 321. The dust collecting filter 312 removes the micro-dust by its fine mesh structure.

The storage container main body 301 is mounted on the moving means. The moving means includes a moving stage 314 and a base 316. The moving stage 314 is the member which is directly mounted on the storage container main body 301 to support the storage container main body 301. The moving stage 314 is mounted on the storage container main body 301 by mounting means 315 such as a mechanical pin. The base 316 is the member which supports the moving stage 314. The moving stage 314 is adopted to be moved in parallel on the base 316 while supported by the base 316. Position detection means (not shown) is provided in the base 316. The position detection means includes a photosensor and a micro-mechanical switch. The position detection means can detect the precise position (precise position with respect to the semiconductor wafer storage container mounting means 303) of the storage container main body 301 mounted on the moving stage 314. Therefore, when the storage container main body 301 is moved by the moving stage 314 to come into close contact with the semiconductor wafer storage container mounting means 303, the position detection means detects the position of the storage container main body 301 which is in close contact with the semiconductor wafer storage container mounting means 303. Further, the position detection means is connected to the mechanism which fixes the storage container main body 301, and the position detection means transmits a detection signal indicating the position of the storage container main body 301. The semiconductor wafer storage container mounting means 303 is operated according to the detection signal to fix the storage container main body 301 in the airtight manner. In the case the semiconductor wafer storage container is manually mounted, the moving stage 314 and the base 316 are not required. The airtight maintaining seal is provided in the mating surface between the storage container main body 301 and the semiconductor wafer storage container mounting means 303, and the storage container main body 301 and the semiconductor wafer storage container mounting means 303 are mounted by mechanically pressing against each other.

The inside of the semiconductor wafer storage container mounting means 303 has a space in which the lid unit 302 can freely be moved to be opened and closed while the semiconductor wafer storage container mounting means 303 is coupled to the storage container main body 301. The space constitutes apart of the gas replacing passage which is closed from the environment.

Lid unit detaching means 304 and lid unit detaching control means 305 are provided in the semiconductor wafer storage container mounting means 303. The lid unit detaching means 304 detaches the lid unit 302 from the storage container main body 301 inside the semiconductor wafer storage container mounting means 303. The lid unit detaching control means 305 controls the action of the lid unit detaching means 304. The lid unit detaching means 304 is coupled to the lid unit 302 to operate fixation and release of the lid unit 302 with respect to the storage container main body 301. The lid unit detaching means 304 also separates the lid unit 302, which is released from the fixation, from the storage container main body 301. The lid unit detaching control means 305 controls the above actions of the lid unit detaching means 304.

Gas passage switching means includes the third valve 321 and the fourth valve 319. These valves are automatically or manually switched according to the procedure.

The method for replacing the gas with the gas replacing apparatus shown in FIG. 11 will be described below.

In a first step, the semiconductor wafer storage container 1 is mounted on the moving stage 314, and the semiconductor wafer storage container 1 is moved to be mounted on the semiconductor wafer storage container mounting means 303.

In a second step, the lid unit 302 is demounted from the storage container main body 301 by the lid unit detaching means 304 to form a predetermined gap between the lid unit 302 and the storage container main body 301, and the inside of the storage container main body 301 is connected to the gas replacing passage in the semiconductor wafer storage container mounting means 303. Lid unit detaching control means 305 controls the lid unit detaching means 304.

In a third step, the evacuating means is operated to start the evacuation of the air in the semiconductor wafer storage container. In the operation of the evacuating means, the fourth valve 319 and the fifth valve 320 are closed, the evacuation pump 309 is operated, and the fourth valve 319 is opened to evacuate the gas in the semiconductor wafer storage container mounting means 303. In this step, the inside of storage container main body 301 is simultaneously evacuated.

In a fourth step, while the gas is evacuated by the gas evacuating means, the gas is introduced from the gas introducing means into the semiconductor wafer storage container. Specifically, the first valve 317 is opened to introduce the gas the gas supply means 308 into the semiconductor wafer storage container mounting means 303. At this point, in the gas flowing into the semiconductor wafer storage container mounting means 303 from the third valve 321 side, when the gas passes through between the largely opened lid unit 302 and the storage container main body 301 to be circulated to the second valve 318 side, the coming and going of the gas occur in the storage container main body 301 and the semiconductor wafer storage container mounting means 303, which allows the gas to be entirely replaced in the storage container main body 301.

The high-purity dry nitrogen gas is used as the gas used in the fourth step. According to the processing status of the semiconductor wafers in the container, sometimes dry argon gas is used. Further, for the purpose of the cost reduction, sometimes the gas in which dry air is mixed with the high-purity dry nitrogen gas is used. In this case, it is desirable that at least 95% nitrogen gas is contained in the mixture gas.

At the time when the fourth step is started, it is not necessary that the inside of the semiconductor wafer storage container 1 is evacuated in high vacuum, but is sufficient that the semiconductor wafer storage container 1 is evacuated in a reduced-pressure state. The many conventional gas replacing apparatuses have closed-system structures in which one port is used for both the gas inlet and the gas outlet. In the conventional gas replacing apparatus, when the gas remains in the semiconductor wafer storage container before the fourth step, because the residual gas affects the replacement gas purity, it takes at least 30 to 60 minutes to replace the gas. On the contrary, the gas replacing apparatus according to the invention has an open-system structure, so that the gas in the semiconductor wafer storage container 1 is efficiently replaced by performing the gas introduction and the gas evacuation at the same time.

After the gas introduction and the gas evacuation are performed for a given time in the fourth step, the gas introduction from the gas introducing means to the semiconductor wafer storage container and the gas evacuation from the semiconductor wafer storage container by the gas evacuating means are stopped in a fifth step. Specifically, at the same time when the first valve 317 is closed to stop the gas supply from the gas supply means 308, the fourth valve 319 is closed. Then, after the fifth valve 320 is opened, the evacuation pump 309 is stopped. The time necessary for the fourth step depends on the volume of the semiconductor wafer storage container or the processing status of the semiconductor wafer. Typically, for the semiconductor wafer storage container having the volume of about 60 liters, it takes at least about 10 to 30 minutes to perform the fourth step.

Then, in a sixth step, the gas in the semiconductor wafer storage container is circulated with the gas circulating means. Specifically, the second valve 318 and the third valve 321 are opened, and the circulating pump 311 is operated to circulate the gas replaced in the fifth step. At this point, the circulated gas has the function of removing the impurities and functional groups on the surface of the semiconductor wafers. The chemical adsorption filter 310 adsorbs the moisture and impurity elements to clean the circulated gas. At this point, in the semiconductor wafer storage container, the lid unit 302 is demounted, and the inside of the storage container main body 301 is communicated with the circulating gas passage, so that the gas in the storage container main body 301 is replaced. It takes about 5 to 30 minutes to circulate the gas.

When the high-purity dry nitrogen gas having the purity in the range of about 99.5% to about 99.999% is used as the gas introduced in the fourth step, the moisture and impurities adsorbed on the semiconductor wafer surfaces can be efficiently removed in the sixth step.

In the gas introduced in the fourth step, the not more than about 5% reactive gas is mixed with the high-purity dry nitrogen gas not lower than 99% in purity. The reactive gas includes the ozone gas, the hydrogen gas, the ammonia gas having the purity not lower than 99%, or the reactive gas includes the mixture gas of the above-described gases. Therefore, in the sixth step, the effect of removing the moisture and impurities adsorbed on the semiconductor wafer surfaces is enhanced, and the surface cleaning effect is obtained in about 5 to 10 minutes.

Thus, in the case where the dry nitrogen gas with which the reactive gas is mixed is used in the fourth step, in order to prevent the reactive gas from remaining in the semiconductor wafer storage container, the steps from the fourth step to the sixth step are repeated using the high-purity dry nitrogen gas in which the reactive gas is not included.

After the sixth step, in a seventh step, the second valve 318 and the third valve 321 are closed to stop the gas circulation. Then, the lid unit 302 is mounted on the storage container main body 301 by the lid unit detaching means 304, the gas is inserted into the storage container main body 301 in the airtight manner, and the semiconductor wafer storage container is demounted from the semiconductor wafer storage container mounting means 303 to end the gas replacing step. It is possible that the semiconductor wafer storage container is manually demounted from the semiconductor wafer storage container mounting means 303, or it is possible that the semiconductor wafer storage container is automatically demounted from the semiconductor wafer storage container mounting means 303 using the moving stage 314. In the automatic operation, the demounting is performed according to time control which is previously determined by the conditions.

Third Embodiment

Figure 12:
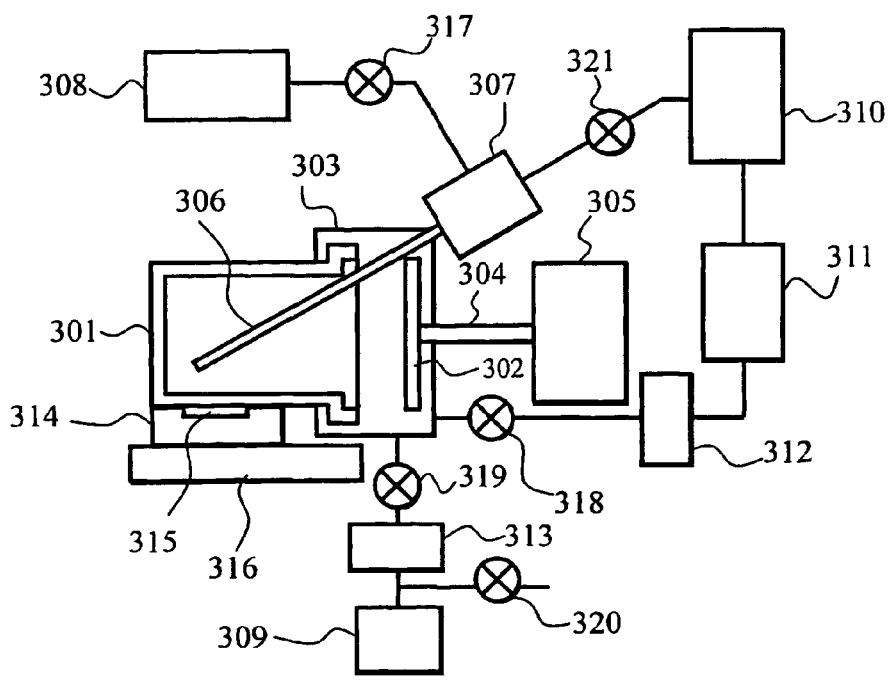
FIG. 12 is a block diagram showing a basic configuration of a gas replacing apparatus according to a third embodiment of the invention.

A third embodiment of the invention will be described. FIG. 12 shows a configuration of a gas replacing apparatus according to the third embodiment of the invention. In FIG. 12, the same element as for FIG. 11 is indicated by the same reference numeral, and the description of the element is omitted. The third embodiment shown in FIG. 12 differs from the second embodiment shown in FIG. 11 in that a gas introducing nozzle 306 and nozzle moving means 307 are provided in the gas introducing means.

The gas introducing nozzle 306 is one which introduces the gas into the deep portion in the storage container main body 301 from a gap between the storage container main body 301 and the lid unit 302. The gas introducing nozzle 306 is connected to the gas piping from the gas supply means 308 and to the gas piping from the gas circulating means through muzzle moving means 307. The gas introducing nozzle 306 is designed to issue a jet of the introduced gas or the circulated gas from the leading end. Specifically, the gas introducing nozzle 306 is connected to the gas supply means 308 and the chemical adsorption filter 310 through the first valve 317 and the third valve 321 respectively. Accordingly, the gas introducing nozzle 306 introduces the gas into the deep portion in the storage container main body 301 by appropriately switching the first valve 317 and the third valve 321. The gas includes the new gas from the gas supply means 308 and the circulated gas purged by the chemical adsorption filter 310. The gas introducing nozzle 306 is formed by a bar-shaped pipe material which is expanded and contracted.

A size of the gas introducing nozzle 306 is set according to the gap which is formed by storing many semiconductor wafers in the storage container main body 301. Namely, an outer diameter of the gas introducing nozzle 306 is designed to be smaller than the gas between the semiconductor wafers adjacent to each other stored in the storage container main body 301. The number of gas introducing nozzles 306 is provided according to the number of gaps formed by the stored semiconductor wafers. It is also possible to set the outer diameter of the gas introducing nozzle 306 and the number of gas introducing nozzles 306 as appropriate. Namely, from the viewpoint of replacement efficiency, it is desirable that the outer diameter and the number of gas introducing nozzles 306 are set corresponding to all the gaps formed by the semiconductor wafers. However, from the viewpoint of production cost, the number of gas introducing nozzles 306 is set as appropriate.

The nozzle moving means 307 has the function of expanding and contracting the gas introducing nozzle 306 so that the gas introducing nozzle 306 is put in and taken out from the gap between the storage container main body 301 and the lid unit 302. Therefore, the gas introducing nozzle 306 is moved by the nozzle moving means 307 while can be expanded and contracted, and the gas introducing nozzle 306 can be inserted into and taken out from the gap between the storage container main body 301 and the lid unit 302. Further, in the nozzle moving means 307, it is also possible to provide an angular adjustment mechanism which can adjust the angle of the gas introducing nozzle 306 as necessary. The jet of gas can be issued at the optimum position (position where the gas in the storage container main body 301 can most efficiently be replaced) according to the shape of the storage container main body 301 and the like by adjusting the amount of expansion and the angle of the gas introducing nozzle 306. The already-existing technology is used for an expansion and contraction mechanism of the gas introducing nozzle 306. For example, the technology which expands and contracts an antenna is used. The already-existing technology is also used for the angular adjustment.

The method for replacing the gas in the semiconductor wafer storage container using the gas replacing apparatus shown in FIG. 12 will be described below. The gas replacing method of the third embodiment differs from the gas replacing method of the second embodiment in that a step of inserting the gas introducing nozzle is added prior to the third step in the gas replacing method described above referring to FIG. 11. In the step of inserting the gas introducing nozzle, the gas introducing nozzle 306 is inserted into the gap between the storage container main body 301 and the lid unit 302. The gap is formed in the second step. As mentioned later, the gas introducing nozzle 306 can be inserted to a bottom portion of the storage container main body 301, and the gas introducing nozzle 306 can be inserted to an entrance of the storage container main body 301. The leading end of the gas introducing nozzle 306 can be inserted to an arbitrary position according to the structure of the storage container main body 301. In order to finely control the gas introducing nozzle 306, the angle of the gas introducing nozzle 306 is simultaneously adjusted by the angular adjustment mechanism. Therefore, the jet of the gas is issued from the leading end of the gas introducing nozzle 306 located at the optimum position, the gas in the storage container main body 301 is pushed out into the semiconductor wafer storage container mounting means 303 to replace the gas in the storage container main body 301.

Because the steps after the gas replacement are similar to the third to fifth steps described above referring to FIG. 11, the descriptions are not repeated. However, in the seventh step, before the lid unit 302 is connected to the storage container main body 301 by the lid unit detaching mechanism 304, the gas introducing nozzle 306 is taken out from the storage container main body 301.

Accordingly, the gas replacing operation can efficiently be performed in a shorter time when compared with the first embodiment.

Fourth Embodiment

Figure 13:
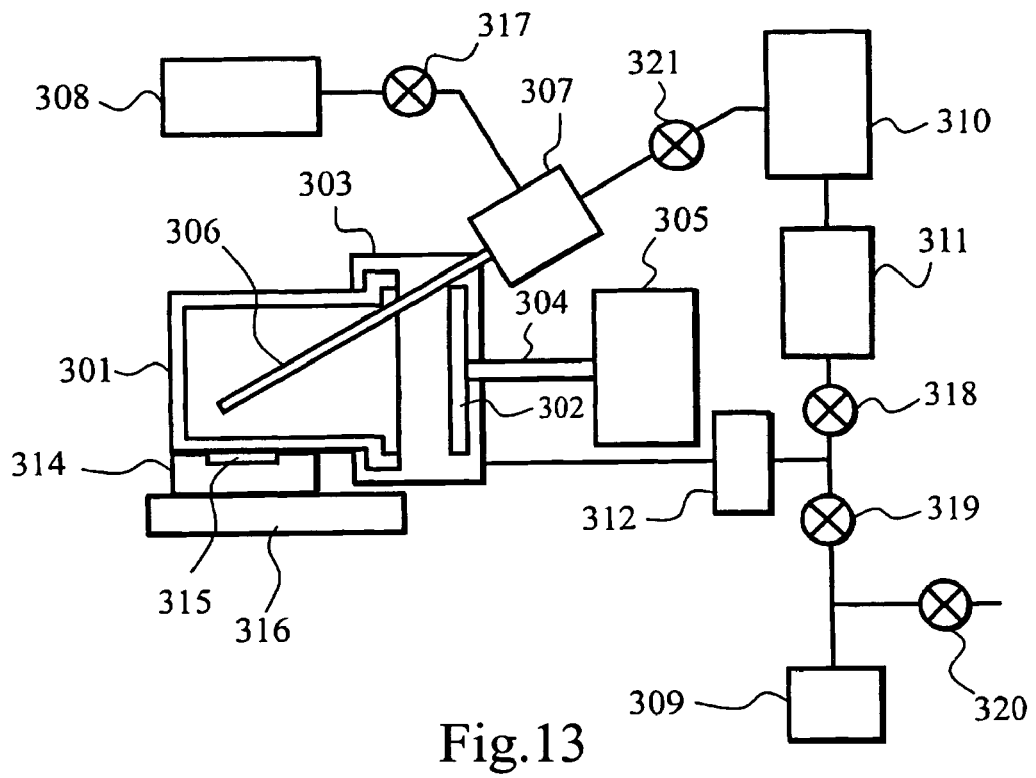
FIG. 13 is a block diagram showing a basic configuration of a gas replacing apparatus according to a fourth embodiment of the invention.

A fourth embodiment of the invention will be described. FIG. 13 shows a configuration of an apparatus for replacing gas in a semiconductor wafer storage container according to the fourth embodiment of the invention. The fourth embodiment shown in FIG. 13 differs from the third embodiment shown in FIG. 12 in that a part of the gas circulating means and a part of the gas evacuating means are shared with each other. Namely, the gas piping including the dust collecting filter 312 is provided by the gas circulating means and the gas evacuating means. Therefore, the dust collecting action can be performed to the gases of both gas circulating means and the gas evacuating means using only one dust collecting filter 312, and the structure of the gas replacing apparatus can be simplified. The gas replacing method with the gas replacing apparatus shown in FIG. 13 is similar to the third embodiment shown in FIG. 12, so that the descriptions is not repeated.

Therefore, the same effects as for the above embodiments can be obtained.

Fifth Embodiment

Figure 14:
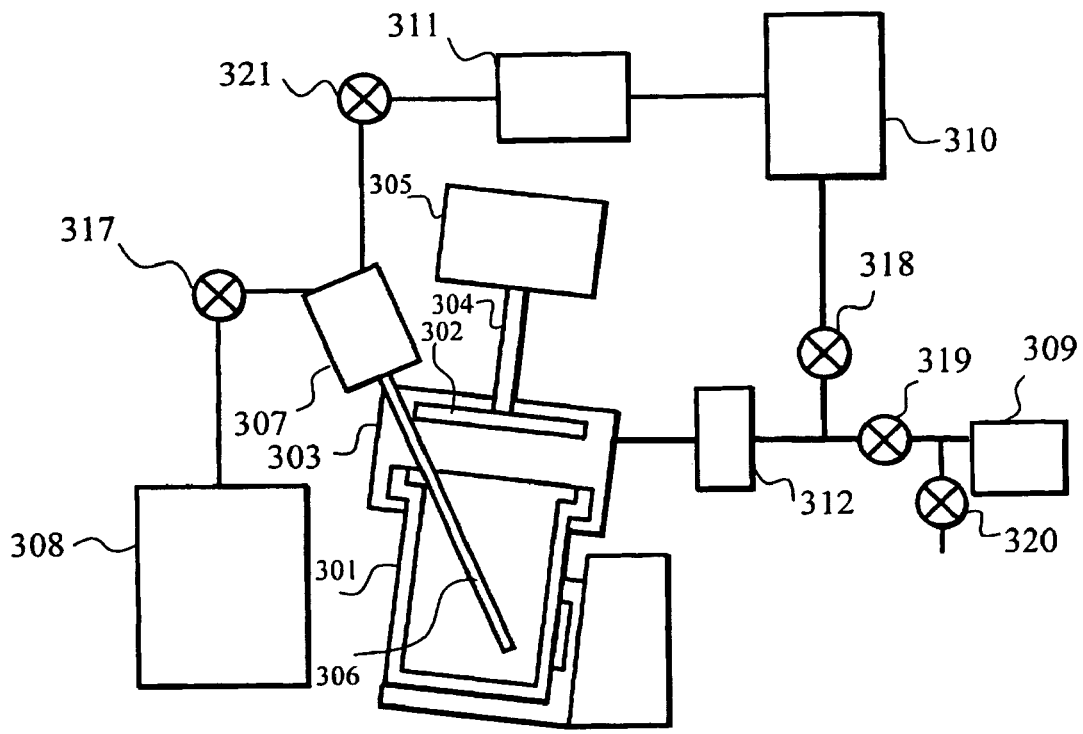
FIG. 14 is a sectional view showing a basic configuration of a gas replacing apparatus according to a fifth embodiment of the invention.

A fifth embodiment of the invention will be described. FIG. 14 shows a configuration of a gas replacing apparatus according to the fifth embodiment of the invention. The fifth embodiment shown in FIG. 14 differs from the embodiments shown in FIGS. 12 and 13 in a mounting attitude of the semiconductor wafer storage container. In FIG. 14, the semiconductor wafer storage container is mounted while the lid unit 302 side faces upward. In this case, when the semiconductor wafer storage container is mounted while the lid unit 302 side faces directly above, because the semiconductor wafers stored in the semiconductor wafer storage container are not stabled, the semiconductor wafer storage container is mounted while slightly tilted with respect to the vertical direction.

The feature of the fifth embodiment shown in FIG. 14 is the gas replacing step. Namely, a heavy gas replacing step for filling the semiconductor wafer storage container with the gas whose specific gravity larger than that of the air is performed prior to the fourth step described above referring to FIG. 12. Specifically, the gas such as an inert gas or a carbon dioxide gas whose specific gravity is larger than that of Ar is introduced from the gas introducing nozzle. Therefore, the introduced gas collects at the bottom portion of the storage container main body 301, which allows the initial air including the moisture and the like to be efficiently removed. Accordingly, the replaced gas purity can be improved in a short time. At this point, in order that the replaced gas collects efficiently at the bottom portion of the storage container main body 301, the semiconductor wafer storage container is arranged while the lid unit side faces upward. The semiconductor wafer storage container is arranged while slightly tilted from the vertical line. In order that the gas collects efficiently, it is desirable that the tilt is not more than about 45 degrees with respect to the vertical line.

Sixth Embodiment

A sixth embodiment of the invention will be described. In the gas replacing apparatus of the sixth embodiment of the invention, the detail structure will be described. FIG. 15 is a partial sectional view showing a method for detaching the semiconductor wafer storage container in the gas replacing apparatus according to the sixth embodiment of the invention. The semiconductor wafer storage container shown in FIG. 15 is arranged while the lid unit side faces upward. However, it is also possible that the semiconductor wafer storage container is arranged while the lid unit side faces horizontally.

FIG. 15A is a partial sectional view showing the state in which the semiconductor wafer storage container is mounted on a moving stage 410. At this point, a semiconductor wafer 400 is stored in a storage container main body 401, and the storage container main body 401 is sealed by a lid unit 402. An airtight maintaining seal 403 keeps airtight between the storage container main body 401 and the lid unit 402. Usually the elastic structure referred to as O-ring is used as the airtight maintaining seal 403. The elastic structure is made of rubber resins or silicone resins.

A mechanical pin support 412 is mounted on the storage container main body 401, and a mechanical pin 411 is provided in a moving stage 410. The storage container main body 401 is fixed to the moving stage 410 by fitting the mechanical pin 411 into the mechanical pin support 412. The moving stage 410 is supported by a base 413, and the moving stage 410 can be moved in parallel along the base 413.

The semiconductor wafer storage container mounting means includes a dust collecting wall 415 and storage container main body mounting means 407. The dust collecting wall 415 is the member which constitutes a dust collecting chamber 416. The dust collecting chamber 416 entirely accommodates the lid unit 402 to constitute a part of the gas replacing passage. A detachment moving mechanism 408 is accommodated in the dust collecting chamber 416 formed by a dust collecting wall 415. The storage container main body mounting means 407 is the member which fixes the storage container main body 401 onto the dust collecting wall 415 side. The storage container main body mounting means 407 is formed in L-shaped in section, and the storage container main body mounting means 407 is rotatably attached to the dust collecting wall 415. The storage container main body mounting means 407 hooks a flange portion of the storage container main body 401 to be fixed to the storage container main body 401 by changing the storage container main body mounting means 407 to the closed state from the opened state shown in FIG. 15A. The storage container main body mounting means 407 is manually or automatically rotated according to the setting.

The gas introducing means is mounted on the dust collecting wall 415 in the airtight manner. The gas introducing means includes a gas introducing nozzle 405 and nozzle moving means 406. Lid unit detaching means includes a detachment moving mechanism 408 and lid unit detaching control means 404. The detachment moving mechanism 408 and the lid unit detaching control means 404 are mounted on the dust collecting wall 415 in the airtight manner while connected to each other. A gas outlet 409 is provided in the dust collecting wall 415. The gas outlet 409 is coupled to the gas evacuating mean and the gas circulating means. At this point, the gas introducing nozzle 405 is contracted, and the detachment moving mechanism 408 is also accommodated upward. The gas introducing means is obliquely attached to the dust collecting wall 415 in association with the angle at which the gas introducing nozzle 405 can be inserted into the storage container main body 401 from the gap between the storage container main body 401 and the lid unit 402.

As shown in FIG. 15B, the moving stage 410 is moved on the base 413 toward the direction shown by an arrow 417 to cause the storage container main body 401 to come into close contact with an airtight maintaining seal 414 provided in the dust collecting wall 415, which forms the dust collecting chamber 416 between the dust collecting wall 415 and the lid unit 402. The dust collecting chamber 416 is the space where the lid unit 402 can be opened and closed.

Then, as shown in FIG. 15C, the storage container main body mounting means 407 is closed to fix the storage container main body 401 to the dust collecting wall 415. The storage container main body mounting means 407 has the mechanical locking mechanism, and the storage container main body mounting means 407 is operated according to a signal from a position detection sensor of the storage container main body 401 (not shown).

FIG. 16 is a partial sectional view showing the action of the lid unit detaching means. FIG. 16A is a partial sectional view when the state of FIG. 15C is viewed from the direction in parallel with the semiconductor wafer 400. In FIG. 16A, the gas introducing means and the moving stage are neglected. In the storage container main body 401, the semiconductor wafers 400 are stored while arranged in parallel at constant intervals. A lid unit latching structure 418 and a lid unit holding mechanism 413 are mounted on the lid unit 402. The lid unit latching structure 418 fixes and releases the lid unit 402 to and from the storage container main body 401 such that the lid unit latching structure 418 is attached to and detached from a connection hole 416 of the storage container main body 401. The lid unit holding mechanism 413 is attached to and detached from a lid unit latching structure detaching mechanism 423. The lid unit latching structure detaching mechanism 423 fitted into the lid unit holding mechanism 413 fixes and releases the lid unit 402 to and from the storage container main body 401 while attaching and detaching the lid unit 402. FIG. 16A shows a state in which the lid unit latching structure 418 is inserted into the connection hole 416 to connect the lid unit 402 to the storage container main body 401. The detachment moving mechanism 408 attached to the dust collecting wall 415 is accommodated in the upper portion while separated from the lid unit 402.

As shown in FIG. 16B, the lid unit detaching control means 404 moves the detachment moving mechanism 408 in parallel toward the direction shown by an arrow 419 to connect the leading end of the lid unit latching structure detaching mechanism 423 to the lid unit holding mechanism 413.

As shown in FIG. 16C, when the lid unit detaching control means 404 rotates the lid unit latching structure detaching mechanism 423, the lid unit latching structure 418 is activated to be taken from the connection hole 416, which separates the storage container main body 401 from lid unit 402. When the lid unit latching structure detaching mechanism 423 is rotated, the leading end of the lid unit latching structure detaching mechanism 423 is held by the lid unit holding mechanism 413. Therefore, the lid unit latching structure detaching mechanism 423 and the lid unit 402 are coupled to each other.

As shown in FIG. 16D, the lid unit detaching control means 404 moves the detachment moving mechanism 408 in parallel toward the direction of an arrow 422 while holding the lid unit 402, and the detachment moving mechanism 408 forms a predetermined gap between the lid unit 402 and the storage container main body 401. In the case where the gas introducing nozzle 405 (not shown) is used, the sufficient gap into which the gas introducing nozzle 405 is sufficiently inserted may be formed. In the case where the gas introducing nozzle 405 is not used, the gap of several millimeters may be formed so that the gas passage is formed between the lid unit 402 and the airtight maintaining seal 403.

Figure 18A:
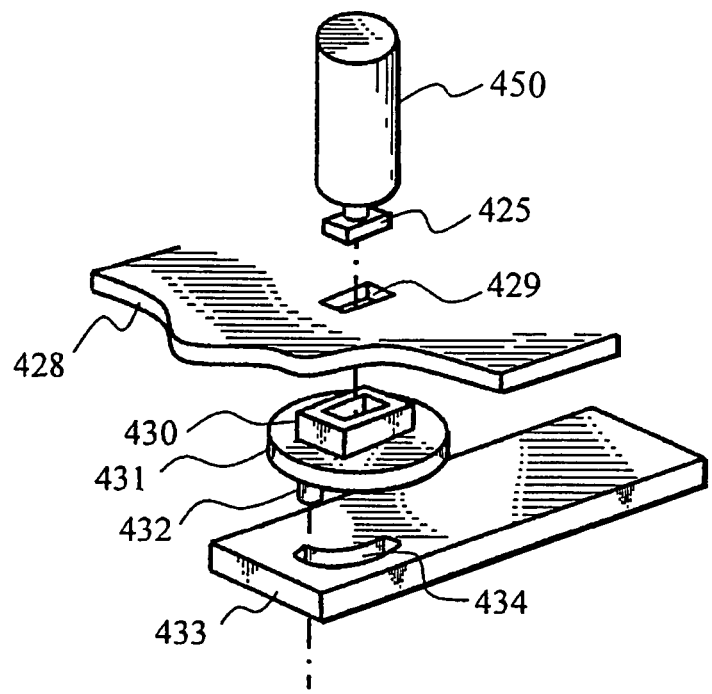
FIG. 18a is a partial sectional view showing a lid latching structure of the gas replacing apparatus according to the invention.

FIG. 18 shows a configuration of the lid unit latching structure 418. As shown in FIG. 18A, the lid unit latching structure includes a slide structure 433, a disc structure 431, and a guide plate 428. The slide structure 433 is moved in parallel and inserted into a connection hole 416 made in the storage container main body 401. The rotatable disc structure 431 has a lid unit detaching means mounting structure 430 in the rotating center while a pin 432 is formed in the outer periphery. The guide plate 428 guides the movement of the slide structure 433. The guide plate 428 also acts as the presser of the disc structure 431. The slide structure 433 is fitted into the pin 432 provided in the outer periphery of the disc structure 431 through a rotatable long hole 434. The rectangular hole 434 is made while having the sufficiently short length when compared with the mount of movement of the pint 432.

A rectangular mounting unit 425 is formed at the leading end of the lid unit latching structure detaching mechanism 423. The mounting unit 425 is inserted into a rectangular hole made in a lid unit detaching means mounting structure 430 through a rectangular support hole 429 made in a guide structure. The arc-shaped long hole 434 is made in the slide structure 433, and the long hole 434 engages the disc structure 431. It is possible that the long hole 434 has the shape in which the slide structure 433 is reciprocally moved by the disc structure 431. The long hole 434 may be formed in other shapes except for the arc.

Figure 18B:
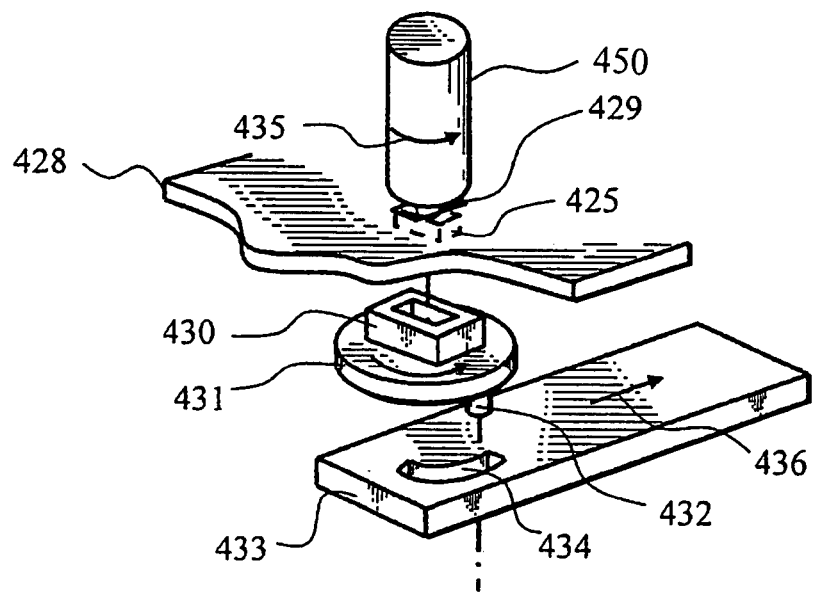
FIG. 18b showing the detaching mechanism of FIG. 18a rotated in the direction of the arrow.

After the mounting unit 425 is inserted into the lid unit detaching means mounting structure 430, when the lid unit latching structure detaching mechanism 423 is rotated in a direction shown by an arrow 435 of FIG. 18B, the disc structure 431 is rotated. The pin 432 inserted into the hole 434 is simultaneously rotated according to the rotation of the disc structure 431, and the slide structure 433 is moved in parallel in the direction shown by a narrow 436. As a result, the leading end of the slide structure 433 is inserted into the connection hole 416 to connect the storage container main body 401 and the lid unit 402. At the same time, the support hole 429 and the mounting unit 425 are aligned to take out the lid unit latching structure detaching mechanism 423 from the lid unit 402. When the storage container main body 401 and the lid unit 402 are separated, the lid unit latching structure detaching mechanism 423 is rotated in the reverse direction while the mounting unit 425 is inserted into the lid unit detaching means mounting structure 430 through the support hole 429. As the lid unit latching structure detaching mechanism 423 is rotated, the mounting unit 425 located at the leading end of the lid unit latching structure detaching mechanism 423 is supported between a lid unit supporting mechanism 430 and the guide structure 428, and the lid unit detaching mechanism 423 and the lid unit 402 are connected and held. The lid unit detaching control means 404 controls the lid unit detaching means.

Figure 17:
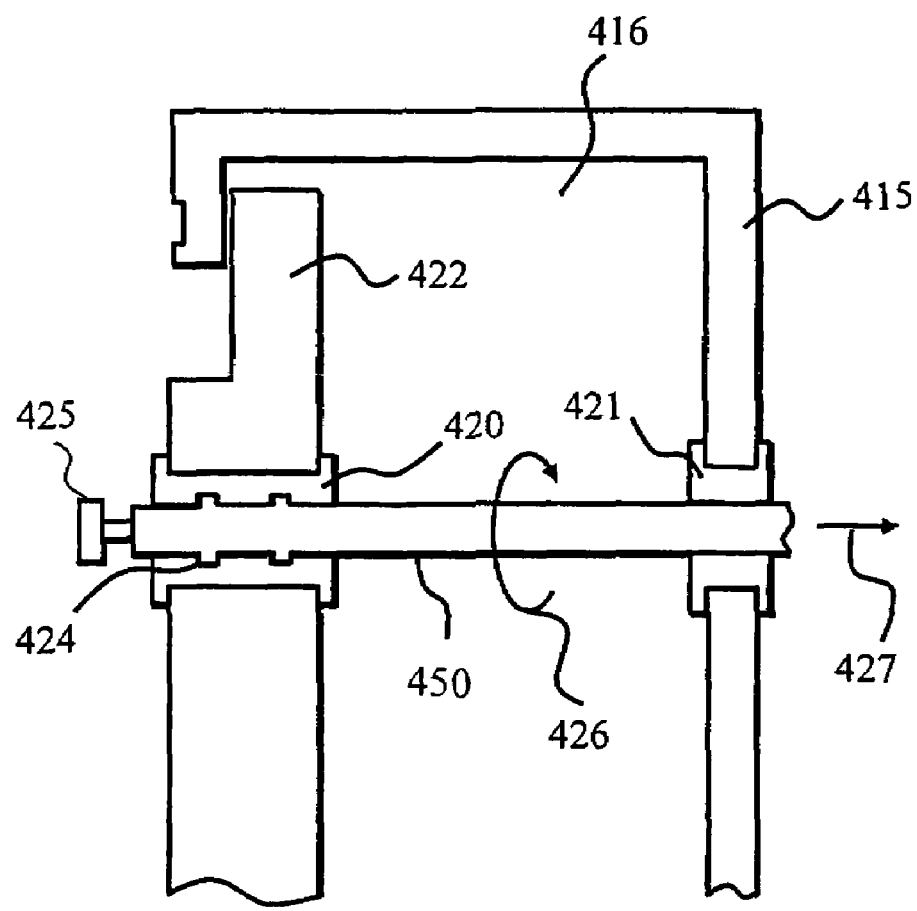
FIG. 17 is a partial sectional view showing a configuration of the gas replacing apparatus according to the invention.

FIG. 17 shows a specific configuration of the lid unit detaching mechanism. In the lid unit detaching mechanism shown in FIG. 17, one rotating and moving shaft 450 is shared with the lid unit latching structure detaching mechanism and the detachment moving mechanism. The lid unit latching structure detaching mechanism constitutes a part of the lid unit detaching mechanism. A mounting portion 425 of the lid unit latching structure detaching mechanism is formed at the leading end of the rotating and moving shaft 450. Therefore, the structure of the lid unit detaching mechanism can remarkably be simplified. The rotating and moving shaft 450 is mounted in bearings 420 and 421. It is possible that general ball bearing is used ad the bearings 420 and 421. However, sometimes the dust and the oil mist may be generated to contaminate the gas passage. Therefore, it is preferable that a fluorine-contained polymer bearing is used as the bearings 420 and 421. The fluorine-contained polymer bearing has good slide properties, and the dust and the oil mist are never generated from in the fluorine-contained polymer bearing. Teflon (product name from DuPont) is well known as the specific material.

The bearing 420 is mounted in a detachment moving supporting mechanism 422 to rotatably support the rotating and moving shaft 450, and an anti-disconnection latch 424 is formed in order to prevent the disconnection of the rotating and moving shaft 450. The bearing 421 is mounted in the dust collecting wall 415 to connect the rotating and moving shaft 450. The bearing 421 also rotatably supports the rotating and moving shaft 450 so that the rotating and moving shaft 450 can be moved in parallel. By providing at least two rotating and moving shafts 450 in the detachment moving supporting mechanism 422, only the rotating and moving shaft 450 can be rotated as shown by an arrow 426 while the detachment moving supporting mechanism 422 is not rotated. Further, the rotating and moving shaft 450 and the detachment moving supporting mechanism 422 can be moved in the dust collecting chamber 416 by moving the rotating and moving shaft 450 in the direction of an arrow 427.

Figure 19A:
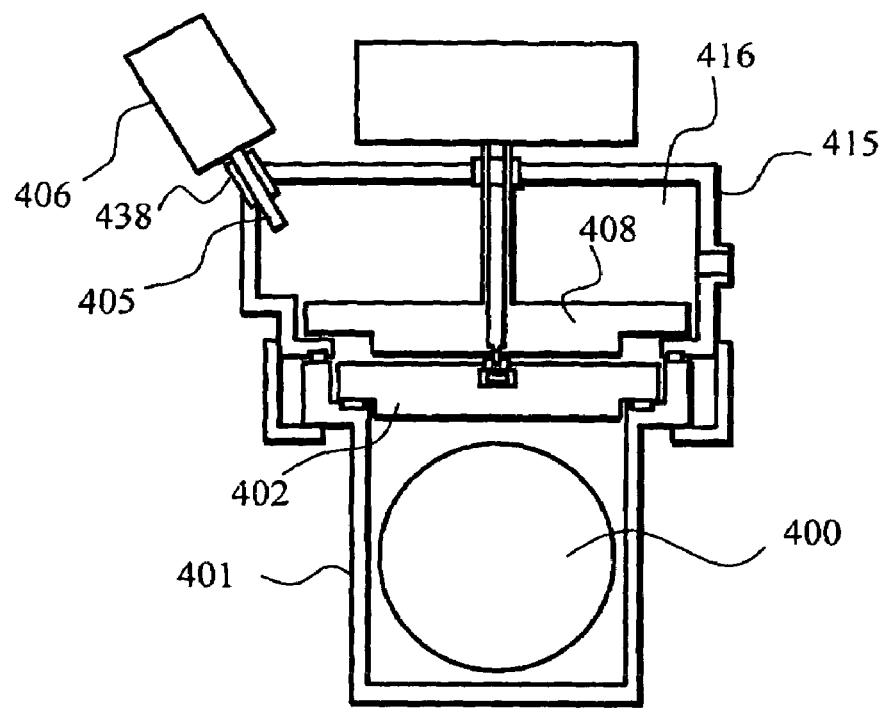
FIG. 19a is a partial sectional view of a sixth embodiment of the invention showing a gas introducing nozzle before insertion.

Referring to FIG. 19, the insertion of the gas introducing nozzle 405 will be described. FIG. 19A shows the state in which the storage container main body 401 and the lid unit 402 are connected before the gas introducing nozzle 405 is stretched. The detachment moving mechanism 408 falls down in the dust collecting chamber 416 to be coupled to the lid unit 402. At this point, the gas introducing nozzle 405 is accommodated in the nozzle moving means 406 so that the detachment moving mechanism 408 can freely be moved in the dust collecting chamber 416. The gas introducing nozzle 405 is mounted in the dust collecting wall 415 while the airtightness is kept by an airtight maintaining seal 438. The gas introducing nozzle 405 is put in and taken out from the storage container main body 401 while the airtightness is maintained in the dust collecting chamber 416.

Figure 19B:
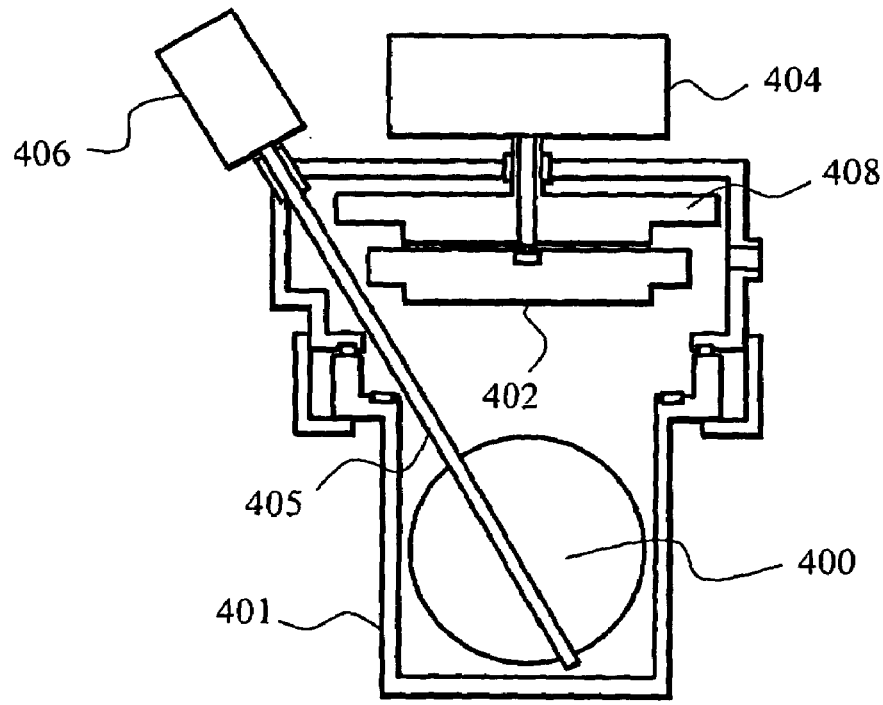
FIG. 19b is a partial sectional view showing the gas introducing nozzle after insertion.

In FIG. 19B, the detachment moving mechanism 408 controlled by the lid unit detaching control means 404 is activated to separate the lid unit 402 from the storage container main body 401 at a predetermined distance. The gas introducing nozzle 405 is stretched from the inside of the nozzle moving means 406, and the gas introducing nozzle 405 is inserted into the storage container main body 401 through the gap between the storage container main body 401 and the lid unit 402. In FIG. 19B, the gas introducing nozzle 405 is inserted to the bottom portion of the storage container main body 401 through the side face of the semiconductor wafer 400. The gas introducing nozzle 405 is inserted to the bottom portion of the storage container main body 401, the jet of the replacement gas is issued from the leading end of the gas introducing nozzle 405 to the bottom portion of the storage container main body 401 to efficiently push out the gas in the storage container main body 401. Therefore, the gas replacement efficiency is improved. Since the gas between the stored semiconductor wafers 400 is as narrow as not more than about 10 mm, an attachment angle of the gas introducing nozzle 405 to the dust collecting wall 415 is accurately set. Even if the gas introducing nozzle 405 comes into contact with the semiconductor wafer 400, in order to prevent the breakage of the semiconductor wafer 400, it is preferable that the leading end portion of the gas introducing nozzle 405 is coated with the fluorine-contained polymer material (for example, Teflon: product name from DuPont). It is also possible that the gas introducing nozzle 405 is not inserted to the bottom portion of the storage container main body 401, but the insertion of the gas introducing nozzle 405 is stopped at the upper portion of the storage container main body 401. Because the gas replacement efficiency depends on the various conditions such as the number of semiconductor wafers 400, the sizes of the semiconductor wafer 400 and the storage container main body 401, and air quantity and speed of the gas blown from the gas introducing nozzle 405, the amount of insertion of the gas introducing nozzle 405 is set at the optimum position according to the conditions. The insertion angle of the gas introducing nozzle 405 is also set at the optimum angle in the stage in which the gas introducing nozzle 405 is attached to the dust collecting wall 415.

The gas replacing method with the gas replacing apparatus having the above configuration is similar to the gas replacing method described in the first embodiment.

Seventh Embodiment

A seventh embodiment of the invention will be described below. The gas introducing nozzle 405 is improved in the seventh embodiment.

As shown in FIG. 20, the gas introducing nozzle 405 includes a main nozzle and a sub-nozzle. Specifically, in the gas introducing nozzle 405, a pipe portion which emerges from the nozzle moving means 406 constitutes the main nozzle, and the sub-nozzles 405a and 405b are branched from the main nozzle. The sub-nozzles 405a and 405b are rotated about the main nozzle, which allows a blow opening at the leading end of the sub-nozzles 405a and 405b to be moved in the deep portion of the storage container main body 401. The main nozzle is coupled to the sub-nozzles 405a and 405b to rotate the sub-nozzles 405a and 405b. The main nozzle is also put in and taken out from the storage container main body 401.

A nozzle accommodation chamber 437 is integrally provided in the dust collecting wall 415. The nozzle accommodation chamber 437 is the space where the main nozzle and the sub-nozzles 405a and 405b are accommodated. The nozzle accommodation chamber 437 is formed in the square accommodation space in which the plurality of sub-nozzles 405a and 405b can entirely be accommodated while horizontally arranged in parallel. Since the main nozzle and the sub-nozzles 405a and 405b are accommodated in the nozzle accommodation chamber 437, the main nozzle and the sub-nozzles 405a and 405b does not become an obstacle when the lid unit 402 is attached to and detached from the storage container main body 401. The main nozzle (gas introducing nozzle 405) extends from the inside of the nozzle accommodation chamber 437 to the outside to be connected to the nozzle moving means 406. The airtight maintaining seal 438 is provided at the portion where the gas introducing nozzle 405 extends from the inside of the nozzle accommodation chamber 437 to the outside, and the nozzle accommodation chamber 437 and the storage container main body 401 are sealed.

The nozzle moving means 406 supports and rotates the main nozzle of the gas introducing nozzle 405, and the nozzle moving means 406 also has the function of putting in and taking out the main nozzle.

Figure 20A:
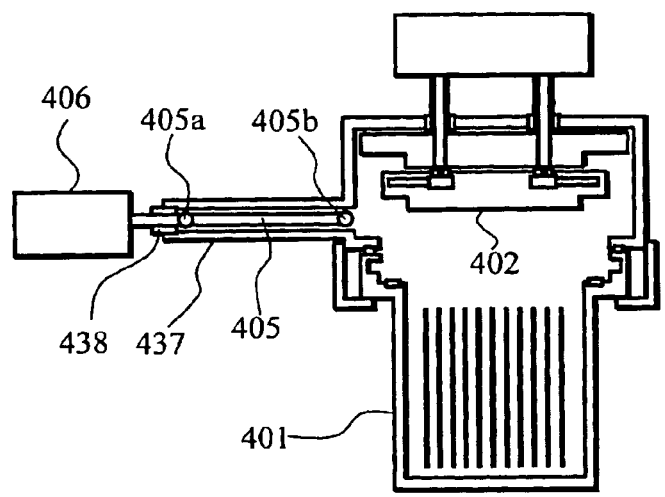
FIG. 20a is a partial sectional view of a seventh embodiment of the invention showing a gas introducing nozzle before insertion.

FIG. 20A shows the state in which the lid unit 402 is separated from the storage container main body 401. In FIG. 20A, the main nozzle and the sub-nozzles 405a and 405b are horizontally accommodated in the nozzle accommodation chamber 437. The main nozzle is accommodated in the nozzle accommodation chamber 437 while the airtightness is kept by the airtight maintaining seal 438. The lid unit 402 is separated from the storage container main body 401 by the method shown in the first embodiment.

Figures 20B, 20C:
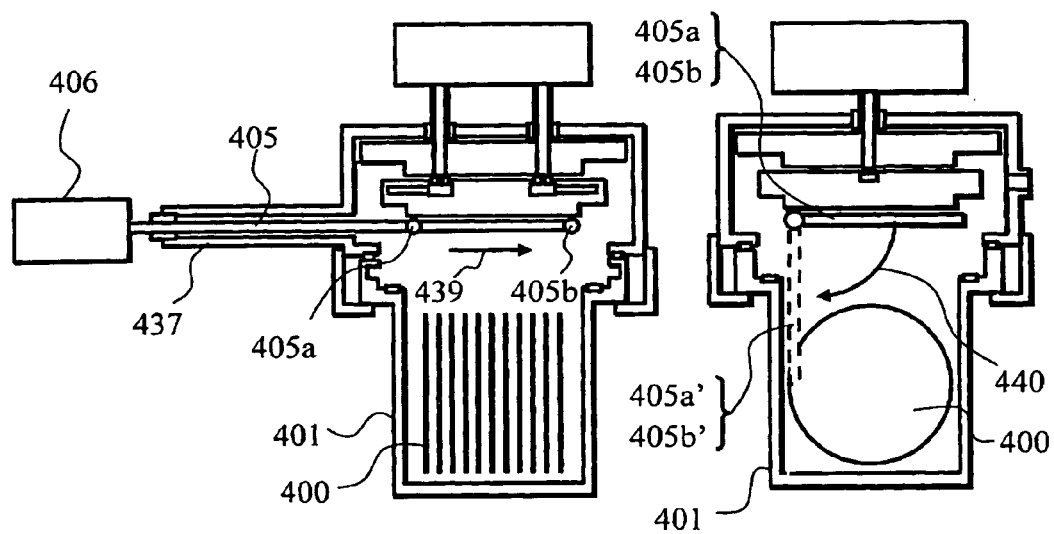
FIG. 20b is a partial sectional view of the seventh embodiment of the invention showing the gas introducing nozzle in the middle of insertion.
FIG. 20c is a partial sectional view of the seventh embodiment of the invention showing the gas introducing nozzle after insertion.

Then, as shown in FIG. 20B, the nozzle moving means 406 moves the main nozzle of the gas introducing nozzle 405 in the horizontal direction shown by an arrow 439. When the sub-nozzles 405a and 405b reach the appropriate position, the movement of the main nozzle is stopped. In FIG. 20B, the movement of the main nozzle 405 is stopped when the sub-nozzles 405a and 405b reach the position of the gap formed by the side faces of the semiconductor wafer 400 and the storage container main body 401.

FIG. 20C is a partial sectional view when FIG. 20B is viewed from another side face. In this state of things, the sub-nozzles 405a and 405b are rotated about the main nozzle in the direction shown by an arrow 440. Therefore, the sub-nozzle can be moved to the position in the storage container main body 401. The sub-nozzle after the movement is shown by broken lines and the numerals of 405a' and 405b'. In taking out the gas introducing nozzle 405, the exactly reverse actions may be performed. Therefore, even if the gas introducing nozzle has the plurality of sub-nozzles, the gas introducing nozzle can be smoothly inserted because the structure is simple.

Figure 21A:
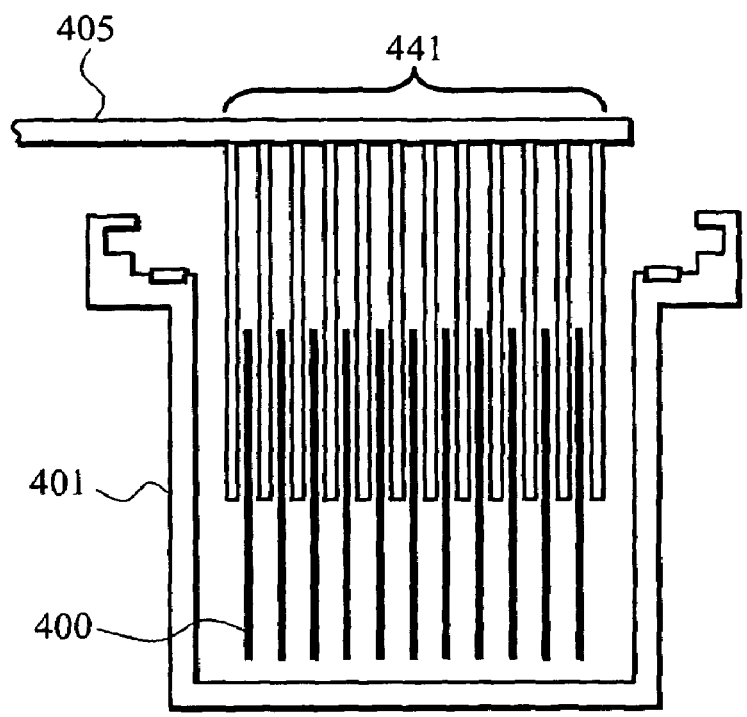
FIG. 21a is a partial sectional view of a modification of the seventh embodiment wherein sub-nozzles are arranged in gaps between semiconductor wafers.

In this case, the number of sub-nozzles 405a and 405b is set at two. However, it is possible that the number of sub-nozzles is appropriately set. FIG. 21 shows an example of the number of sub-nozzles. In FIG. 21, the gas introducing nozzle 405 has sub-nozzles 441 which are branched into the number corresponding to the number of gaps of the semiconductor wafers 400. FIG. 21A shows an example in which the sub-nozzles 441 are inserted into the gaps of the semiconductor wafers 400 respectively. The sub-nozzles 441 are inserted into all the gaps formed by the semiconductor wafers 400 to directly introduce the gas into the bottom portion of the storage container main body 401, and the gas is introduced to the individual space partitioned by the semiconductor wafers 400. Therefore, the gas replacement efficiency is improved. In this case, because the gas formed by the semiconductor wafers 400 is as narrow as about 10 mm, it is preferable that the sub-nozzle 441 has the diameter not more than about 5 mm. Further, in order to prevent the breakage of the leading end of the nozzle, it is necessary that the leading end of the nozzle is coated with the fluorine-contained polymer such as Teflon.

Figure 21B:
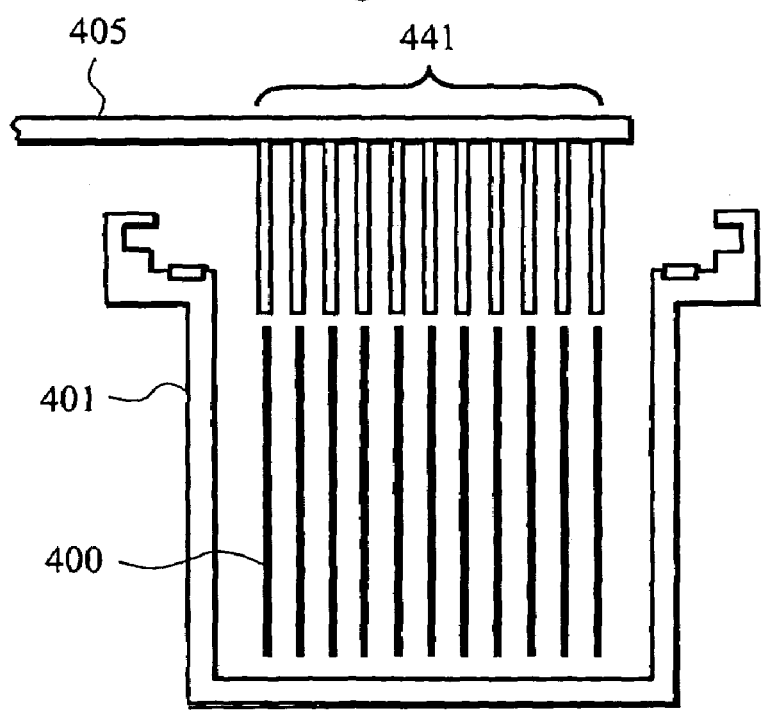
FIG. 21b is a partial sectional view of a modification of the seventh embodiment wherein sub-nozzles are arranged above and in alignment with each of the semiconductor wafers.

In FIG. 21B, the sub-nozzles 441 are arranged so that the leading ends of the sub-nozzles 441 are located near the position opposite the semiconductor wafer 400. In this case, the length and the rotating angle of the sub-nozzles 441 are appropriately adjusted so that the gas can blow all the surface of the semiconductor wafer 400. The jet of the introduced gas issued from each sub-nozzle 441 flows on the surface of the semiconductor wafer 400 in a form of a semi-laminar flow or sometimes in a form of a turbulent flow depending on air quantity and the like. Therefore, the cleaning effect of the wafer surface is particularly increased in gas circulating step. Further, there is no fear that the surface of the semiconductor wafer 400 is damaged by the contact of the sub-nozzle 441.

In seventh embodiment, the length and the rotating angle of the sub-nozzles 441 are appropriately adjusted. It is also possible that the sub-nozzles 441 are not fixed, but the sub-nozzles 441 swing while rotating right and left. Therefore, the jet of the gas can efficiently be issued to the whole of surface of the semiconductor wafer 400.

In the seventh embodiment, the sub-nozzles 405a and 405b are set so as to emerge along the axial direction of the main nozzle. However, it is also possible that the sub-nozzles 405a and 405b are set so as to be moved in the direction in which the main nozzle is moved in parallel. It is possible that the sub-nozzles 405a and 405b provided on the leading end side are rotated about the base end portion of the main nozzle. It is also possible that the sub-nozzles 405a and 405b emerge in any direction, however, the mechanism is complicated.

Eighth Embodiment

Figure 22:
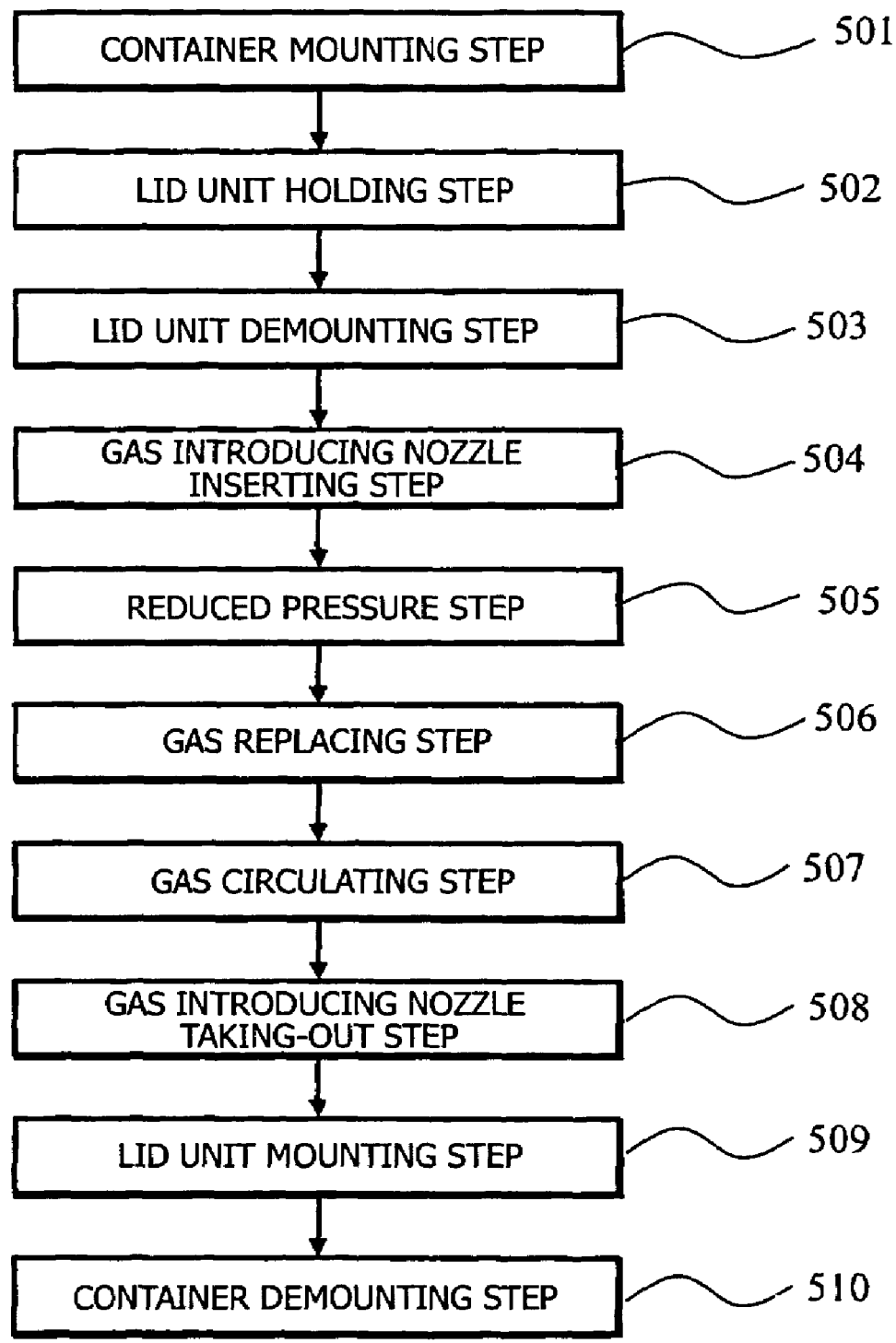
FIG. 22 is a flowchart showing steps of a gas replacing method according to the invention.

Referring to FIG. 22, the gas replacing method with the semiconductor wafer storage container gas replacing apparatus of the invention shown in FIG. 13 will be described in detail.

In a container mounting step 501, while the lid unit 402 is caused to enter the dust collecting chamber, the semiconductor wafer storage container is mounted on the semiconductor wafer storage container mounting means 303 in the airtight manner. At this point, as shown in FIG. 15, the storage container main body 401 and the lid unit 402 are sealed with the airtight maintaining seal 403. Usually, 25 semiconductor wafers 400 are stored in the storage container while arranged in parallel. In the container mounting step 501, the storage container main body 401 is closely fixed by using the storage container main body mounting means 407 to mechanically press the storage container main body 401 against the airtight maintaining seal 414 provided in the dust collecting wall 415. Namely, while the storage container main body mounting means 407 is opened, the storage container main body 401 is pressed against the airtight maintaining seal 414 to close the storage container main body mounting means 407. Therefore, the storage container main body 401 is closely fixed to the dust collecting wall 415. As shown in FIG. 15, the container mounting step 501 may automatically be performed using the moving stage 430 or the container mounting step 501 may manually be performed.

In a lid unit holding step 502, both the detachment moving mechanism 408 and the lid unit latching structure detaching mechanism 423 are moved and brought close to the lid unit 402, and the lid unit is connected by fitting the mounting unit 425 of the lid unit latching structure detaching mechanism 423 into the lid unit holding mechanism 130 and the like. Referring to FIG. 16, the specific action will be described below. The lid unit latching structure detaching mechanism 423 is moved and brought close to the lid unit 402 by the lid unit detaching control mechanism 404, and the leading end of the lid unit latching structure detaching mechanism 423 is inserted into the lid unit holding mechanism 413 to hold the lid unit 402. The detachment moving mechanism 408 is driven by transmission of the force from the drive source such as the motor in the detaching drive mechanism 404 provided outside the dust collecting wall 415.

Then, in a lid unit demounting step 503, the lid unit latching structure 418 which connects the storage container main body 401 and the lid unit 402 is operated by the lid unit latching structure detaching mechanism 423, and the storage container main body 401 and the lid unit 402 are separated. FIG. 16 shows the specific actions of the lid unit demounting step 503. In the lid unit demounting step 503, the lid unit latching structure detaching mechanism 423 is rotated by the detaching drive mechanism 404 to demount the lid unit latching structure 418, and the detachment moving mechanism 408 is moved by using the detaching drive mechanism 404 again. The lid unit 402, which is held at the detachment moving mechanism 408 by both the lid unit latching structure detaching mechanism 423 and the lid unit holding mechanism 413, is moved at the same time. Therefore, the storage container main body 401 and the lid unit 402 are separated from each other. The separation of the storage container main body 401 and the lid unit 402 forms the gap between the airtight maintaining seal 403 and the lid unit 402, and the storage container main body 401 and the dust collecting chamber 416 are connected by the gas passage.

In a gas introducing nozzle inserting step 504, the gas introducing nozzle 405 is inserted into the gap between the storage container main body 401 and the lid unit 402. FIG. 19 shows the specific actions of the gas introducing nozzle inserting step 504. As shown in FIG. 19A, at first the lid unit 402 is mounted on the storage container main body 401. Then, as shown in FIG. 19B, the nozzle moving means 406 inserts the gas introducing nozzle 405 to the bottom portion of the storage container main body 401 from the gap between the storage container main body 401 and the lid unit 402. The storage container main body 401 and the lid unit 402 are separated in the lid unit demounting step 503. Therefore, the gas can be introduced into the storage container main body 401 using the gas introducing nozzle 405.

In a reduced pressure step 505, the evacuating means evacuates the dust collecting chamber to reduce the pressure. Specifically, in FIG. 13, the fourth valve 319 and the fifth valve 320 are closed, and the evacuation pump 309 performs degassing in the evacuating pipe. At this point, the third valve 318 is closed. Then, the fourth valve 319 is opened to evacuate the air in the dust collecting chamber. At this point, because the storage container main body 301 and the lid unit 302 are separated, the air in the storage container main body 301 is also evacuated at the same time.

In a gas replacing step 506, while the evacuating means evacuates the dust collecting chamber, the gas is introduced to the storage container main body 301 from the gas introducing nozzle 306. The gas replacing step 506 will specifically be described referring to FIG. 13. The gas introducing nozzle 306 is connected to the gas supply means 308 which includes the gas supply source, the reduced-pressure valve, and the gas supply pipe through the first valve 317. The compressed gas cylinder or gas piping in the clean room, which is of the gas supply source, is in the compressed state of about 7 kg/cm². The compressed state of about 7 kg/cm² is regulated to appropriate supply gas pressure, e.g. in the range of 1.2 to 1.5 kg/cm², by the reduced pressure valve, and the gas is introduced into the storage container main body 301 from the gas introducing nozzle 306 by opening the first valve 317. The gas replacing step 506 is started immediately after the reduced pressure step 505 is started. It is desirable that the gas replacing step 506 is performed after the insides of the storage container main body 301 and the dust collecting chamber are evacuated to the high vacuum state by the reduced pressure step 505. However, it is necessary to use the semiconductor wafer storage container having the excellent withstanding pressure properties. Because the semiconductor wafer storage container is usually molded by the plastic material, from the viewpoint of withstanding pressure properties of the container, it is not preferable that the high vacuum state is made in the reduced pressure state 505.

The introduced gas is the dry nitrogen gas having purity not lower than 95%, preferably the dry nitrogen gas having purity in the range of 99.9 to not lower than 99.999%. The supplied dry gas flows in the laminar flow between the semiconductor wafers 400 stored in the storage container main body 301, and the gas flows into the dust collecting chamber through the gap between the storage container main body 301 and the lid unit 302. Through the gas replacing step 506, while the gas in the storage container main body 301 is replaced with the dry nitrogen gas, the micro-dust adhering to the gap between the storage container main body 301 and the lid unit 302 is blown away and removed, which results in the cleaning of the surface. At this point, the introduced gas is introduced to the bottom portion of the storage container main body 301 from the gas introducing nozzle 306, and the storage container main body 301 is gradually filled with the introduced gas from the bottom portion of the storage container main body 301 to the dust collecting chamber side to push out the already-existing gas to the dust collecting chamber. Further, the introduced gas flows simultaneously over the surface of the semiconductor wafer 400 from the bottom portion of the storage container main body 301, and the micro-dust adhering over the surface of the semiconductor wafer 400 is blown away.

The gas and the micro-dust which flow into the dust collecting chamber are filtered by the dust collecting filter 312, and the gas is exhausted outside the evacuation pump 309 through the fourth valve 319 and the evacuation pipe.

The gas replacing step 506 is performed until the gas purity in the gas replacing passage becomes sufficiently increased, and until the micro-dust in the dust collecting chamber is sufficiently adsorbed and filtered by the dust collecting filter 312. After the gas replacing step 506 is performed for the sufficiently long time, the first valve 317 and the fourth valve 319 are continuously closed. Then, while the fifth valve 320 is opened to take the air into the exhaust pipe, the evacuation pump 309 is stopped 309, and the gas replacing step 506 is ended.

When the semiconductor wafer storage container is stored while the pressure is reduced in the semiconductor wafer storage container, the first valve 317 is closed first. When the semiconductor wafer storage container is stored while the pressure is increased in the semiconductor wafer storage container, the fourth valve 319 is closed first. When storage gas pressure is controlled, a vacuum gage is placed at an appropriate position in the gas passage, e.g. at the dust collecting wall, and the valve can be opened and closed while the gas pressure in the gas passage is measured. Electromagnetic valves which can electrically be opened and closed are used as the valve shown in FIG. 13, and the open and close of the electromagnetic valves are controlled by a control circuit (not shown), which enables automation of the opening and closing operations of the valves.

Then, in a gas circulating step 507, the gas is circulated in the order of the storage container main body 301, the dust collecting means, and the gas introducing nozzle. The gas circulating step 507 is one in which the third valve 318 shown in FIG. 13 is opened and a circulating pump 311 is operated to circulate the gas. The gas circulating step 507 forms the gas circulating passage in which the dry gas replaced in the gas replacing step 506 flows in the order of the circulating pump 311, the chemical adsorption filter 310, the second valve 321, the nozzle moving means 307, the gas introducing nozzle 306, the storage container main body 301, the dust collecting chamber, the dust collecting filter 312, and the third valve 318. In the gas circulating step 507, the impurities and moisture adsorbed on the surfaces of the semiconductor wafers 400 are removed by the circulated gas and filtered by the chemical adsorption filter 310, so that the surfaces of the semiconductor wafers 400 can be cleaned.

In the gas circulating passage in the storage container main body 301 in the gas circulating step 507, the supply side is located on at the bottom portion of the storage container main body 301 which is adjacent the distal end of the gas introducing nozzle 306, and the discharge side is located at the gap between the storage container main body 301 and the lid unit 302. Therefore, the whole of the gas exists in the storage container main body 301 can be smoothly and efficiently circulated.

In the configuration shown in FIG. 13, since the dust collecting filter 312 is included in the gas circulating passage, even if the gas is circulated, the micro-duct is filtered and the gas is cleaned when the circulated gas contains the micro-dust. After the gas circulating step 507 is performed for a predetermined time, the circulating pump 311 is stopped, the third valve 318 is closed, and the gas circulating step 507 is ended.

Then, in a gas introducing nozzle taking-out step 508, the gas introducing nozzle 405 is taken out from the gap between the storage container main body 301 and the lid unit 302. The gas introducing nozzle taking-out step 508 is the reverse step of the gas introducing nozzle inserting step 504 described above referring to FIG. 19.

Referring to FIGS. 19*a* and 19*b*, in a lid unit mounting step 509, both the lid unit latching structure detaching mechanism 423 and the lid unit 402 are moved to insert the lid unit 402 into the storage container main body 401, and the lid unit latching structure 418 is operated by the lid unit latching structure detaching mechanism 423 to connect the storage container main body 401 and the lid unit 402. The lid unit mounting step 509 is one which reverses the lid unit demounting step 503 and the lid unit holding step 502. Namely, the lid unit latching structure detaching mechanism 423 and the lid unit 402 are moved by the detachment moving mechanism 404 to bring the lid unit 402 into close contact with the storage container main body 401, the lid unit latching structure detaching mechanism 423 is rotated to insert the lid unit latching structure 418 into the connection hole 416, and the storage container main body 401 and the lid unit 402 are connected in the airtight manner. Then, the lid unit latching structure detaching mechanism 423 is moved by the detachment moving mechanism 404 to demount the lid unit latching structure detaching mechanism 423 from the lid unit holding mechanism 413.

Finally, in a container demounting step 510, the semiconductor wafer storage container is demounted from the dust collecting means. Then, the gas replacing method of the eighth embodiment is ended.

Figure 23:
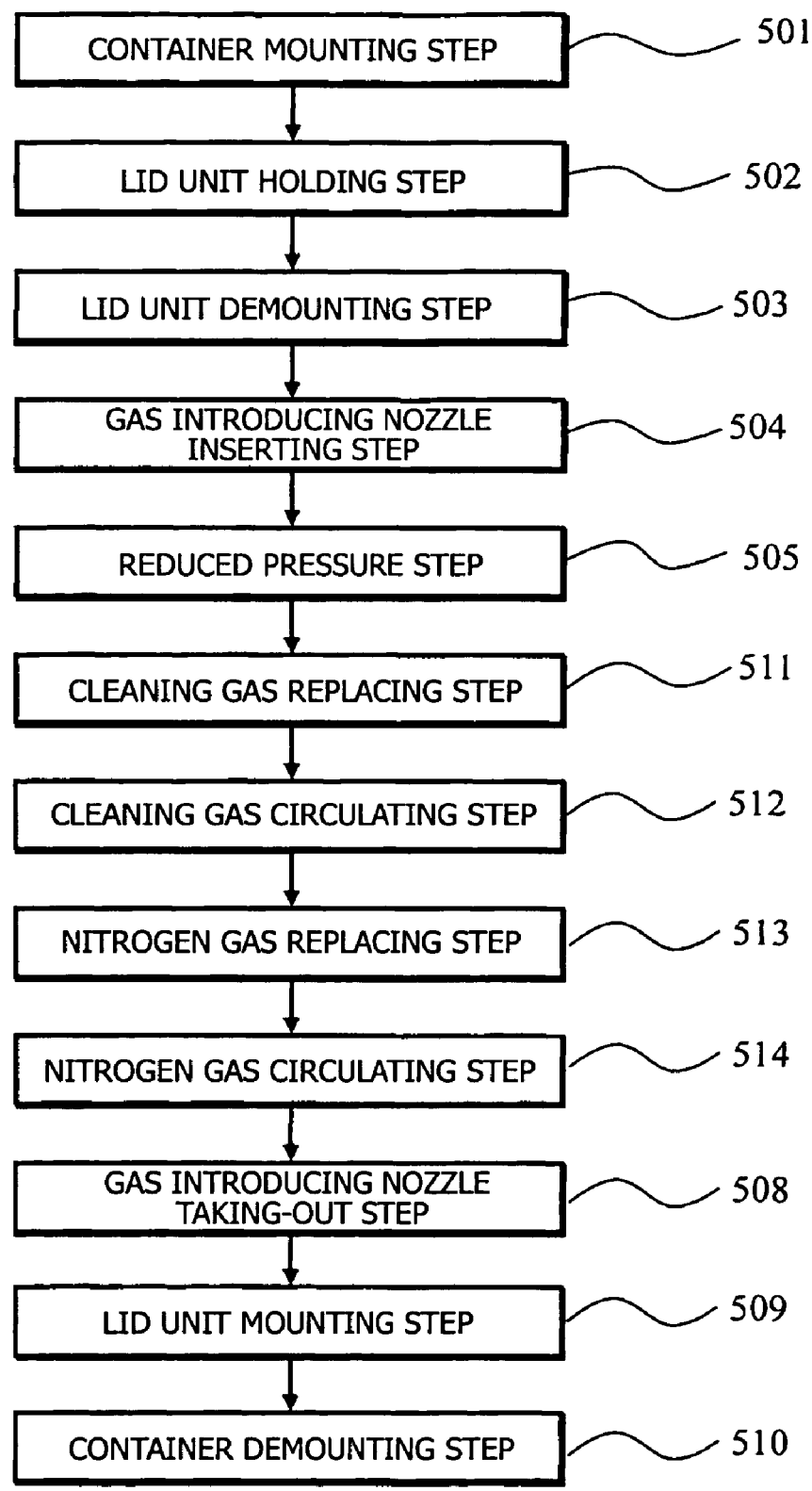
FIG. 23 is a flowchart showing steps of a gas replacing method according to the invention.

Each one of the gas replacing step 506 and the gas circulating step 507 is provided in the gas replacing method of the eighth embodiment. However, the replacement and the circulation may be performed by using the cleaning gas and the nitrogen gas. Namely, in order to improve cleanness of the semiconductor wafer surface in a short time, a cleaning gas replacing step and a cleaning gas circulating step can be added after the reduced pressure step 505 shown in FIG. 22. In this case, a flowchart of a semiconductor wafer storage container gas replacing method of the invention is shown in FIG. 23. In the flowchart shown in FIG. 23, as described above, the gas replacing step 506 (the cleaning gas replacing step 511 shown in FIG. 23) and the gas circulating step 507 (the cleaning gas circulating step 512 shown in FIG. 23) shown in FIG. 22 are performed using the not more than about 5% reactive gas which is mixed with the dry nitrogen gas as the replacement gas. Addition of the steps obtains the cleaning effect of the semiconductor wafer surface in a shorter time compared with the flowchart shown in FIG. 22.

As shown in FIG. 23, when the cleaning gas replacing step 511 and the cleaning gas circulating step 512 are performed, sometimes the reactive gas remains in the semiconductor wafer storage container to damage the surface of the semiconductor wafer 400 in a time-varying manner, so that a nitrogen gas replacing step 506 and a nitrogen gas circulating step 507 are performed subsequent to the cleaning gas replacing step 511 and the cleaning gas circulating step 512. The nitrogen gas replacing step 506 and the nitrogen gas circulating step 507 differ from the cleaning gas replacing step 511 and the cleaning gas circulating step 512 only in that the dry nitrogen gas having the purity not lower than 95% with no reactive gas is used. The nitrogen gas replacing step 506 and the nitrogen gas circulating step 507 are performed, which allows the semiconductor wafers to be stored in the semiconductor wafer storage container without damaging the semiconductor wafer surfaces.

When the semiconductor wafer storage container gas replacing method of the invention shown in FIG. 22 is performed, first gas supply means for supplying the reactive gas and second gas supply means for supplying the nitrogen gas are used as the gas supply means. The reactive gas including at least one gas component of the ozone gas, the hydrogen gas, and the ammonia gas, which is mixed with the nitrogen gas in a proportion of not more than about 5%, can be used as the reactive gas supplied from the first gas supply means. It is possible that the reactive gas including at least one gas component of the ozone gas, the hydrogen gas, and the ammonia gas is mixed with the nitrogen gas supplied from the second gas supply means in a predetermined proportion. When the gases are mixed using the first gas supply means and the second gas supply means, a gas mixture ratio is adjusted with a gas flowmeter.

When a trace quantity of active gas is used in the cleaning gas replacing step 511 and the cleaning gas circulating step 512, or when the reactive gas has the low reactivity, the nitrogen gas circulating step 507 can be neglected.

As described above, according to the semiconductor wafer storage container gas replacing apparatus and the gas replacing method therewith of the invention, while the atmosphere in the generally-used semiconductor wafer storage container can be replaced with the target gas in a short time, the semiconductor wafer surface can be cleaned by circulating the replacement gas. Therefore, the semiconductor wafer forming step suitable for the high density can be realized. Since the gas replacement can be automatized, the gas replacing apparatus and the gas replacing method are compatible with the automatized load/unload system, and the contamination in the process room such as the clean room can be suppressed to a minimum level.

Further, in the gas replacing apparatus and the gas replacing method therewith of the invention, the already-existing semiconductor wafer storage container can be used in the as-is state, and no additional forming is required. Therefore, the invention is the extremely useful gas replacing apparatus and method which can generally be used.

The semiconductor wafer storage container is described in the first embodiment. However, the same operation and effect as for the first embodiment can be obtained, when the invention is applied to the storage container for the contained pieces except for the semiconductor wafer.

Effects of Second to Eighth Embodiments

In the second embodiment to the eighth embodiment, the following effects are also obtained in addition to the above-described effects.

For the storage container with no replacement gas inlet, the gas replacement can also realized while the lid is opened. Therefore, the above problems can be solved.

Therefore, since the open-system gas replacing apparatus can be realized, the high-purity gas replacement can be realized in a short time by simultaneously performing the gas evacuation and introduction in the storage container. As a result, the above problems can be solved.

The cleaning of the semiconductor wafer surface and the like can be realized in a short time at room temperature by circulating the gas in the storage container through the chemical adsorption filter, so that the above problems can be solved. Particularly, the impurity elements and functional groups adsorbed on the wafer surfaces can effectively be removed in a short time by using the nitrogen gas or the nitrogen gas containing a not more than 5% reactive gas as the circulated gas.

The configuration of the apparatus can be simplified by the structure in which a part of the gas circulating passage formed by the gas circulating means is shared with the gas evacuating means.

Therefore, the dust adhering near the lid unit of the semiconductor wafer storage container can effectively removed, the further clean gas replacement can be realized, and the above problems can be solved.

The gas replacement of the semiconductor wafer storage container can mechanically automatized, the contamination in the clean room can be minimized, and the apparatus and method of the invention can be compatible with the load/unload process in the semiconductor process, so that the above problems can be solved.

The airtight maintaining seal is provided in the mating surface between the storage container main body and the storage container mounting means to prevent the leakage of the gas to the outside environment. Therefore, high-purity gas replacement is enabled.

Since the gas can easily be introduced from the gap between the storage container main body and the lid unit, the above problems can be solved. The gas replacement can be realized in a short time by inserting the gas introducing nozzle into the gap between the contained pieces such as the semiconductor wafer. The laminar flow of the replacement gas can be formed on the surface of the contained pieces such as the semiconductor wafer by arranging the gas introducing nozzle while bringing the gas introducing nozzle close to the contained pieces such as the semiconductor wafer, the cleaning effect of the contained pieces such as the semiconductor wafer can be enhanced, and the above problems can be solved.

Both the lid unit latching structure detaching mechanism and the detachment moving mechanism are configured by the same rotating and moving shaft which is rotatable and movable in parallel, the rotating and moving shaft is rotatably connected in the gas passage forming mechanism by a fluorine-contained polymer bearing with an anti-disconnection latch, and the rotating and moving shaft is connected in the dust collecting wall by another fluorine-contained polymer bearing in an airtight manner while being rotatable and movable in parallel. Therefore, the apparatus configuration can be simplified, the apparatus can be configured so that the micro-dust is not generated, and the purity of the gas replacement can be improved.

On the other hand, a storage container gas replacing method including the following steps of (a) to (f) is realized as the method for replacing the gas in the storage container using the storage container gas replacing apparatus of the invention. The storage container gas replacing method including the steps of: (a) mounting a storage container on a gas replacing apparatus; (b) separating the storage container and the lid unit to provide a predetermined gap between the storage container and the lid unit; (c) evacuating air in a storage container main body with gas evacuating means; (d) introducing gas into the storage container main body with gas introducing means while the gas introducing means evacuates the gas in the storage container main body; (e) terminating introduction of the gas into and the evacuation of the gas from the storage container main body to cause gas circulating means to circulate the gas in the storage container main body through a chemical adsorption filter; and (f) demounting the storage container from the gas replacing apparatus.

According to the storage container gas replacing method of the invention, the gas replacement and the cleaning of the contained pieces such as the semiconductor wafer can be realized in a short time, so that the above problems can be solved.

A method for replacing gas in a storage container using a storage container gas replacing apparatus of the invention, the storage container gas replacing method including the steps of: (a) mounting the storage container on storage container mounting means in an airtight manner while a lid unit is accommodated in a dust collecting chamber; (b) bringing a gas passage forming mechanism and a lid unit latching structure detaching mechanism close to the lid unit by simultaneously moving the gas passage forming mechanism and the lid unit latching structure detaching mechanism, and connecting and holding the lid unit by a lid unit holding mechanism; (c) operating a lid unit latching structure to separate the storage container main body and the lid unit by the lid unit latching structure detaching mechanism, and forming a gap between the lid unit and the storage container main body, the lid unit latching structure connecting the storage container main body and the lid unit; (d) inserting a gas introducing nozzle into the gap between the lid unit and the storage container main body; (e) evacuating the dust collecting chamber by evacuating means to reduce pressure; (f) introducing the gas into the storage container main body from the gas inlet of the storage container main body by gas introducing means, while the evacuating means evacuates the dust collecting chamber; (g) circulating the gas in the order of the storage container main body, the dust collecting means, and the gas inlet of the storage container; (h) taking out the gas introducing nozzle from the gap between the lid unit and the storage container main body; (i) inserting the lid unit into the storage container main body by simultaneously moving the lid unit latching structure detaching mechanism and the lid unit, and operating the lid unit latching structure to connect the storage container main body and the lid unit by the lid unit latching structure detaching mechanism; and (j) demounting the storage container from the dust collecting means.

According to the gas replacing method of the invention, the gas replacement of the storage container can automatically or semi-automatically be realized, the high-purity gas replacement and the cleaning of contained pieces such as the semiconductor wafer can be realized in a short time, so that the above problems can be solved.

Further, the following steps (u) and (v) are added prior to the step (f) of the above gas replacing method of the invention. Therefore, the cleaning of the contained pieces such as the semiconductor wafer can effectively be performed in a shorter time. Namely, the gas replacing method of the invention further including the steps of (u) introducing a cleaning gas into the storage container main body from a gas inlet of the storage container main body by gas introducing means while the evacuating means evacuates the dust collecting chamber, a not more than 5% reactive gas being mixed with a dry nitrogen gas in the cleaning gas; and (v) circulating the cleaning gas in the order of the storage container main body, the dust collecting means, and the gas inlet of the storage container.

The dry nitrogen gas including at least one gas component of an ozone gas, a hydrogen gas, and an ammonia gas is used as the reactive gas.

The effect of cleaning the contained pieces such as the semiconductor wafer can be enhanced by using a dry gas containing a not lower than 95% nitrogen gas.

Further, the following step (w) is added prior to the step (f) of the above gas replacing method of the invention. Therefore, the higher-purity gas replacement can be realized, and the above problems can be solved. Namely, (w) introducing a heavy gas into the storage container main body from the gas introducing nozzle by gas introducing means while the evacuating means evacuates the dust collecting chamber, the heavy gas including an inert gas and a carbon dioxide gas whose specific gravity is larger than that of an argon gas.

What is claimed is:

1. An apparatus for replacing gas in a storage container which includes a storage container main body having a gas inlet and a lid unit blocking the storage container main body, the apparatus comprising:
   gas introducing means for introducing the gas into the storage container main body;
   gas evacuating means for evacuating the gas in the storage container main body;
   gas circulating means for circulating the gas in the storage container main body through a chemical adsorption; and
   a lid unit latching structure which connects the storage container main body and the lid unit; and
   storage container mounting means capable of mounting the storage container main body so that the lid unit is entirely accommodated in a gas replacing passage,
   wherein the gas introducing means introduces the gas from the gas inlet into the storage container main body,
   the gas evacuating means evacuates the gas in the storage container main body through the storage container mounting means, and
   the gas circulating means includes the chemical adsorption filter in the middle of a gas circulating passage formed between the storage container mounting means and the gas inlet while the gas circulating means sequentially circulates the gas among the storage container main body the storage container mounting means, and the gas inlet.

2. The apparatus according to claim 1, further comprising:
   gas supply means for supplying at least one kind of the gas;
   gas introducing means for introducing the gas from the gas supply means to the gas inlet of the storage container main body;

evacuating means for evacuating the gas in a dust collecting chamber;
lid unit detaching means for detaching the lid unit from the storage container main body in a dust collecting means;
lid unit detaching control means for controlling action of the lid unit detaching means; and
gas flow switching means for switching a gas flow between the evacuating means and the gas circulating means,
wherein the storage container mounting means comprises:
dust collecting means for separating micro-dust generated during a gas replacing step, the dust collecting means being configured by a dust collecting chamber formed to be surrounded by at least a dust collecting wall; and
storage container main body mounting means for mounting the storage container on the storage container mounting means while airtightness is held, the lid unit being entirely accommodated inside the dust collecting chamber,
the evacuating means comprises:
an evacuation pump; and
a dust collecting filter which traps and collects the micro-duct separated by the dust collecting means, and
the gas circulating means includes a circulating pump.

3. The apparatus according to claim 2, wherein the lid unit detaching means are arranged while separated into the inside and the outside of the dust collecting chamber,
inside the dust collecting chamber, the lid unit detaching means comprises:
a lid unit latching structure detaching mechanism which detaches a lid unit latching structure connecting the storage container main body and the lid unit;
a gas flow forming mechanism which is brought close to the lid unit so as to have a predetermined gap to form a gas passage;
a detachment moving mechanism which simultaneously moves the lid unit, the lid unit latching structure detaching mechanism, and the gas flow forming mechanism to form a predetermined gap between the storage container and the lid unit; and
a lid unit holding mechanism which holds the lid unit and the detachment moving mechanism while the lid unit and the detachment moving mechanism are connected, and
outside the dust collecting chamber, the lid unit detaching means includes a detachment driving mechanism which separately drives the lid unit holding mechanism, the lid unit latching structure detaching mechanism, and the detachment moving mechanism.

4. The apparatus according to claim 2, wherein an airtight maintaining seal is provided in a mating surface between the storage container main body and the storage container mounting means.

5. The apparatus according to claim 3, wherein the gas passage forming mechanism which is in contact with the lid unit while separated at the predetermined gap is formed to arrange a pump chamber whose volume of the gap formed in a circumferential portion of the lid unit is sufficiently larger than a volume of the gap formed in a central portion of the lid unit.

6. The apparatus according to claim 5, wherein the gas passage forming mechanism which is in contact with the lid unit while separated at the predetermined gap has at least one communication hole which communicates the dust collecting chamber and the gap formed by the lid unit, the gap being exclusive of the pump chamber, the communication hole being made such that a diameter is gradually increased from the gap side toward the dust collecting chamber side.

7. The apparatus according to claim 3, wherein both the lid unit latching structure detaching mechanism and the detachment moving mechanism are configured by the same rotating and moving shaft which is rotatable and movable in parallel,
the rotating and moving shaft is rotatably connected in the gas passage forming mechanism by a fluorine-contained polymer bearing with an anti-disconnection latch, and the rotating and moving shaft is connected in the dust collecting wall by another fluorine-contained polymer bearing in an airtight manner while being rotatable and movable in parallel.

8. An apparatus for replacing gas in a storage container which includes a storage container main body whose inside is required to be kept clean and a lid unit which seals an inside of the storage container main body, said apparatus comprising:
gas introducing means, which is mounted on the storage container main body in an airtight manner while accommodating the lid unit of the storage container, for introducing gas into the storage container to replace the gas inside the storage container from a gap between the lid unit and the storage container main body by demounting the lid unit while the airtight state is kept,
wherein the gas introducing means includes a gas introducing nozzle which is inserted into the storage container main body from the gap between the storage container main body and the lid unit to introduce gas into the storage container main body.

9. The apparatus according to claim 8, wherein the gas introducing means includes nozzle moving means for putting in and taking out the gas introducing nozzle from the gap between the storage container main body and the lid unit.

10. The apparatus according to claim 9, wherein the gas introducing nozzle is formed by a bar-shaped pipe material which is expanded and contracted, and
the nozzle moving means has a function of expanding and contracting the gas introducing nozzle such that the gas introducing nozzle is put in and taken out from the gap between the storage container main body and the lid unit.

11. The apparatus according to claim 9, wherein the gas introducing nozzle is configured by a bar-shaped pipe material, and
the nozzle moving means has a function of moving the gas introducing nozzle in parallel such that the gas introducing nozzle is put in and taken out from the gap between the storage container main body and the lid unit.

12. The apparatus according to claim 10, wherein the gas introducing nozzle is set in a size according to the gap formed by accommodating contained pieces in the storage container main body, and at least one gas introducing nozzle is provided according to the gap.

13. The apparatus according to claim 9, wherein the gas introducing nozzle is configured to include a sub-nozzle in which a blow opening located at leading end of the sub-nozzle is moved toward a back portion in the storage container main body by rotating the sub-nozzle and a main nozzle which appears into the storage container main body while coupled to the sub-nozzle to rotate the sub-nozzle, and the nozzle moving means has a function of rotating the main nozzle of the gas introducing nozzle and of causing the main nozzle to appear.

14. The apparatus according to claim 13, wherein the sub-nozzle is set in the size according to the gap formed by accommodating the contained pieces in the storage container main body, and at least one sub-nozzle is provided according to the gap.

15. An apparatus for replacing gas in a storage container which includes a storage container main body whose inside is required to be kept clean and a lid unit which seals an inside of the storage container main body, the apparatus comprising:

storage container mounting means for entirely accommodating the lid unit inside while mounting the storage container main body in an airtight manner to form a part of a gas replacing passage;

lid unit detaching means for detaching the lid unit from the storage container main body inside the storage container mounting means;

lid unit detaching control means for controlling action of the lid unit detaching means;

gas introducing means for introducing the gas into the storage container main body from a gap between the lid unit and the storage container main body while the lid unit is demounted from the storage container main body inside the storage container mounting means;

gas evacuating means for evacuating the gas in the storage container main body;

gas circulating means for circulating the gas in the storage container main body to remove foreign matters in the gas with a chemical adsorption filter; and gas flow switching means for switching a gas flow between the gas evacuating means and the gas circulating means.

16. The apparatus according to claim 15, wherein the gas introducing means has a gas introducing nozzle which is inserted into the storage container main body from the gap between the storage container main body and the lid unit to introduce the gas into the storage container main body.

17. The apparatus according to claim 16, wherein the gas introducing means has nozzle moving means for pulling in and taking out the gas introducing nozzle from the gap between the storage container main body and the lid unit.

18. The apparatus according to claim 17, wherein the gas introducing nozzle is configured by a bar-shaped pipe material which is expanded and contracted, and the nozzle moving means has a function of expanding and contracting the gas introducing nozzle such that the gas introducing nozzle is put in and taken out from the gap between the storage container main body and the lid unit.

19. The apparatus according to claim 17, wherein the gas introducing nozzle is configured by a bar-shaped pipe material, and the nozzle moving means has a function of moving the gas introducing nozzle in parallel such that the gas introducing nozzle is put in and taken out from the gap between the storage container main body and the lid unit.

20. The apparatus according to claim 18, wherein the gas introducing nozzle is set in a size according to the gap formed by accommodating contained pieces in the storage container main body, and at least one gas introducing nozzle is provided according to the gap.

21. The apparatus according to claim 17, wherein the gas introducing nozzle is configured to include a sub-nozzle in which a blow opening located at leading end of the sub-nozzle is moved toward a back portion in the storage container main body by rotating the sub-nozzle and a main nozzle which appears into the storage container main body while coupled to the sub-nozzle to rotate the sub-nozzle, and the nozzle moving means has a function of rotating the main nozzle of the gas introducing nozzle and of causing the main nozzle to appear.

22. The apparatus according to claim 21, wherein the sub-nozzle is set in the size according to the gap formed by accommodating the contained pieces in the storage container main body, and at least one sub-nozzle is provided according to the gap.

23. The apparatus according to claim 15, wherein a part of a gas circulating passage formed by the gas circulating means is shared with the gas evacuating means.

24. The apparatus according to claim 15, wherein the storage container mounting means comprises:

dust collecting means for separating micro-dust generated during a gas replacing step, the dust collecting means being formed by a dust collecting chamber formed to be surrounded by a dust collecting wall;

storage container main body mounting means for mounting the storage container on the storage container mounting means while airtightness is held, the lid unit being entirely accommodated inside the dust collecting chamber;

gas supply means for supplying at least one kind of gas to the gas introducing means; and evacuating means for evacuating the gas in the dust collecting chamber, the evacuating means comprises:

an evacuation pump; and a first dust collecting filter which traps and collects the micro-duct separated by the dust collecting means; and the gas circulating means comprises;

a second dust collecting filter; and a circulating pump.

25. The apparatus according to claim 24, wherein the lid unit detaching means are arranged while separated into the inside and the outside of the dust collecting chamber, inside the dust collecting chamber, the lid unit detaching means comprises:

a lid unit latching structure detaching mechanism which detaches a lid unit latching structure connecting the storage container main body and the lid unit;

a detachment moving mechanism which simultaneously moves the lid unit, the lid unit latching structure detaching mechanism to form a predetermined gap between the storage container and the lid unit; and a lid unit holding mechanism which holds the lid unit and the detachment moving mechanism while the lid unit and the detachment moving mechanism are connected, outside the dust collecting chamber, the lid unit detaching means includes a detachment driving mechanism which separately drives the lid unit holding mechanism, the lid unit latching structure detaching mechanism, and the detachment moving mechanism.

26. The apparatus according to claim 15, wherein an airtight maintaining seal is provided in a mating surface between the storage container main body and the storage container mounting means.

27. The apparatus according to claim 15, wherein the gas introducing means has nozzle moving means for moving the gas introducing nozzle and the gas introducing nozzle to put in and take out the gas introducing nozzle from the gap between the storage container main body and the lid unit.

28. The apparatus according to claim 27, wherein the gas introducing nozzle is configured such that the gas introducing nozzle can be moved in parallel in an oblique direction to be put in and taken out from the gap between the storage container main body and the lid unit.

29. The apparatus according to claim 27, wherein the gas introducing nozzle includes the main nozzle and at least one sub-nozzle which is branched from the main nozzle, and
the main nozzle is configured to be movable in parallel and rotatable by the nozzle moving means.

30. The apparatus according to claim 29, wherein the sub-nozzle is configured such that the sub-nozzle can be inserted into the gas between contained pieces stored in the storage container main body.

31. The apparatus according to claim 29, wherein a leading end of the sub-nozzle is configured to be moved while brought close to a position opposite an upper end of the contained pieces stored in the storage container main body.

32. The apparatus according to claim 27, wherein at least a leading end portion of the gas introducing nozzle and the sub-nozzle is coated with a fluorine-contained polymer material.

33. The apparatus according to claim 25, wherein the lid unit latching structure detaching mechanism and the detachment moving mechanism are configured by the same rotating and moving shaft which is rotatable and movable in parallel,
the rotating and moving shaft is rotatably connected in the gas passage forming mechanism by a fluorine-contained polymer bearing with an anti-disconnection latch, and the rotating and moving shaft is connected in the dust collecting wall by another fluorine-contained polymer bearing in an airtight manner while being rotatable and movable in parallel.

34. The apparatus according to claim 15, further comprising:
a moving stage capable of mounting the storage container main body;
a base which supports the moving stage, the moving stage being automatically brought into close contact with or separated from the storage container mounting means by moving the storage container main body connected to the lid unit on the base; and
position detection means for detecting the close contact and separation of the storage container main body,
wherein the storage container main body mounting means automatically detaches the storage container main body according to a detection signal from the position detection means.

* * * * *

UNITED STATES PATENT AND TRADEMARK OFFICE
CERTIFICATE OF CORRECTION

PATENT NO. : 7,314,068 B2 Page 1 of 1
APPLICATION NO. : 11/109863
DATED : January 1, 2008
INVENTOR(S) : Ryuichi Nakano et al.

It is certified that error appears in the above-identified patent and that said Letters Patent is hereby corrected as shown below:

Column 40, line 43 (claim 1, line 10), after "adsorption" insert -- filter --;

Column 40, line 60 (claim 1, line 27), after "body", insert a comma -- , --;

Column 41, line 24 (claim 2, line 30), "duct" should read -- dust --; and

Column 44, line 37 (claim 2, line 30), "micro-duct" should read -- micro-dust --.

Signed and Sealed this

Twenty-ninth Day of July, 2008

JON W. DUDAS
*Director of the United States Patent and Trademark Office*